US012696632B2

(12) United States Patent
Choi et al.

(10) Patent No.: US 12,696,632 B2
(45) Date of Patent: Jul. 28, 2026

(54) DISPLAY APPARATUS INCLUDING OXIDE SEMICONDUCTOR LAYER THIN FILM TRANSISTORS

(71) Applicant: LG Display Co., Ltd., Seoul (KR)

(72) Inventors: So-Hee Choi, Paju-si (KR); Jun-Ho Lee, Paju-si (KR); Sung-Bin Ryu, Paju-si (KR); Sung-Jin Lee, Paju-si (KR); Jei-Hyun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 412 days.

(21) Appl. No.: 18/215,112

(22) Filed: Jun. 27, 2023

(65) Prior Publication Data

US 2024/0008320 A1     Jan. 4, 2024

(30) Foreign Application Priority Data

Jun. 30, 2022     (KR) ........................ 10-2022-0080936

(51) Int. Cl.
| | |
|---|---|
| *H10K 59/12* | (2023.01) |
| *H10D 30/67* | (2025.01) |
| *H10K 59/124* | (2023.01) |
| *H10K 59/38* | (2023.01) |
| *H10K 59/40* | (2023.01) |
| *H10K 59/80* | (2023.01) |
| *H10K 102/00* | (2023.01) |

(52) U.S. Cl.
CPC ....... *H10K 59/124* (2023.02); *H10D 30/6745* (2025.01); *H10D 30/6755* (2025.01); *H10K 59/38* (2023.02); *H10K 59/40* (2023.02); *H10K 59/873* (2023.02); *H10K 2102/351* (2023.02)

(58) Field of Classification Search
CPC .... H10K 50/844; H10K 59/124; H10K 59/38; H10K 59/40; H10K 59/873; H10K 59/1213; H10K 59/12; H10D 30/6745; H10D 30/6755; H10D 30/6734; H10D 30/6723; H10D 86/423; H10D 86/431; H10D 86/471; H10D 86/60; H10D 86/441; H10D 86/425; H10D 86/451
See application file for complete search history.

(56) References Cited

U.S. PATENT DOCUMENTS

| | | | |
|---|---|---|---|
| 2017/0162606 A1* | 6/2017 | Yan .................... | H10D 30/6757 |
| 2017/0256569 A1* | 9/2017 | Ohara .................... | H10D 86/60 |
| 2017/0278869 A1* | 9/2017 | Hiramatsu ........... | H10D 86/441 |

(Continued)

FOREIGN PATENT DOCUMENTS

| | | |
|---|---|---|
| KR | 10-2017-0081060 A | 7/2017 |
| KR | 10-2019-0070909 A | 6/2019 |

(Continued)

*Primary Examiner* — Ida M Soward
(74) *Attorney, Agent, or Firm* — Fenwick & West LLP

(57) ABSTRACT

A display apparatus include a substrate including a display area and a non-display area, a first transistor including a first oxide semiconductor layer on the substrate, a first insulating layer on the first oxide semiconductor layer and a first gate electrode on the first insulating layer, a second transistor including a second oxide semiconductor layer on the substrate, a second gate electrode on the first insulating layer and a second insulating layer on the second gate electrode, and a third transistor including a third oxide semiconductor layer on the substrate and a third gate electrode on the second insulating layer.

49 Claims, 7 Drawing Sheets

(56)             References Cited

U.S. PATENT DOCUMENTS

| | | | | |
|---|---|---|---|---|
| 2017/0278916 A1 * | 9/2017 | Maruyama | ......... | H10K 59/1213 |
| 2018/0233596 A1 * | 8/2018 | Ohara | .................... | H10D 99/00 |
| 2021/0005693 A1 * | 1/2021 | Cho | .................. | H10K 59/1201 |
| 2021/0104558 A1 | 4/2021 | Kim et al. | | |
| 2021/0126070 A1 * | 4/2021 | Kim | .................... | H10K 59/121 |
| 2021/0202634 A1 * | 7/2021 | Moon | .................... | H10D 86/60 |
| 2021/0249491 A1 * | 8/2021 | Kim | ....................... | H10K 71/00 |
| 2021/0408061 A1 * | 12/2021 | Shin | .................. | H10K 59/1213 |
| 2022/0109037 A1 * | 4/2022 | Yuan | .................... | H10K 59/124 |
| 2022/0165806 A1 * | 5/2022 | Yun | .................... | H10K 59/126 |
| 2022/0208911 A1 * | 6/2022 | Cho | .................... | H10K 59/124 |
| 2022/0328532 A1 * | 10/2022 | Ozeki | ................. | H10D 86/443 |
| 2023/0023524 A1 * | 1/2023 | Bae | ....................... | H10K 59/65 |
| 2023/0118675 A1 * | 4/2023 | Kim | .................... | G06F 3/0412 |
| | | | | 345/174 |

FOREIGN PATENT DOCUMENTS

| | | | | |
|---|---|---|---|---|
| KR | 10-2021-0004794 A | 1/2021 | | |
| KR | 10-2021-0041150 A | 4/2021 | | |
| KR | 20220007074 A | * 1/2022 | ........... | G09G 3/3233 |

* cited by examiner

DISPLAY APPARATUS INCLUDING OXIDE SEMICONDUCTOR LAYER THIN FILM TRANSISTORS

CROSS REFERENCE TO RELATED APPLICATIONS

The present application claims the priority benefit of Republic of Korea Patent Application No. 10-2022-0080936 filed in Republic of Korea on Jun. 30, 2022, which is hereby incorporated by reference in its entirety for all purposes as if fully set forth herein.

BACKGROUND

Field

The present disclosure relates to a display apparatus.

Discussion of the Related Art

Examples of display apparatuses include a liquid crystal display apparatus (LCD), a field emission display apparatus (FED), and an organic light emitting display apparatus (OLED). Among the display apparatuses, the organic light emitting display apparatus (OLED) may be a self-emitting display apparatus. The self-emitting display apparatus may include a plurality of sub-pixels, and may emit light by including an emitting device in each sub-pixel without a separate light source. The self-emitting display apparatus has been widely developed because it has a fast response speed and large emission efficiency, luminance, and viewing angle compared to other display apparatuses.

In addition, since the emitting device may be formed on a flexible substrate, a screen can be configured in various shapes such as bending or folding, and can be suitable as a display apparatus for small electronic products such as smart watches due to its excellent thin properties.

In addition, to be applied as a display apparatus such as a smart watch with many still images, a display device including a new type of transistor capable of preventing leakage current in a still image is required. Accordingly, a semiconductor layer using an oxide semiconductor as a thin film transistor that is advantageous for blocking leakage current has been proposed.

SUMMARY

In a display apparatus using different types of semiconductor layers, for example, a polycrystalline semiconductor layer and an oxide semiconductor layer, a process of forming the polycrystalline semiconductor layer and a process of forming the oxide semiconductor layer are separately performed, and thus processes are complicated. In addition, since the polycrystalline semiconductor layer and the oxide semiconductor layer have different characteristics with respect to chemical gases, more complicated processes are required.

A thin film transistor using the oxide semiconductor layer reacts more sensitively to a change in threshold voltage than a thin film transistor using the polycrystalline semiconductor layer. Further, when current stress causes a change in the thin film transistor using the oxide semiconductor layer, the thin film transistor using the oxide semiconductor layer causes problems affecting image and reliability of the display apparatus. In addition, since the thin film transistor using the oxide semiconductor layer has a large current variation value for a unit voltage variation value, there is a problem in that a defect occurs in a low gray level region where precise current control is required.

The inventors of the present disclosure have recognized the above-mentioned problems, and conducted extensive research and experiments to reduce change in a threshold voltage of a transistor and improve performance of a display apparatus. Through the extensive research and experiments, a new display apparatus capable of reducing a rate of current variation due to current stress and improving performance of a display apparatus has been invented.

One or more aspects of the present disclosure are to provide a display apparatus that can improve performance of a display apparatus by improving performance of a transistor.

Additional features, advantages, and aspects of the present disclosure are set forth in the present disclosure and in part will also be apparent from the present disclosure or may be learned by practice of the disclosure. Other features, advantages, and aspects of the present disclosure may be realized and attained by the structure particularly pointed out in the present disclosure, or derivable from, the written description, and claims hereof as well as the appended drawings.

To achieve these and other advantages and in accordance with the purpose of the present disclosure, as embodied and broadly described herein, a display apparatus include a substrate including a display area and a non-display area, a first transistor including a first oxide semiconductor layer on the substrate, a first insulating layer on the first oxide semiconductor layer and a first gate electrode on the first insulating layer, a second transistor including a second oxide semiconductor layer on the substrate, a second gate electrode on the first insulating layer and a second insulating layer on the second gate electrode, and a third transistor including a third oxide semiconductor layer on the substrate and a third gate electrode on the second insulating layer.

In another aspect, a display apparatus includes a substrate including a display area and a non-display area, a first transistor including a first oxide semiconductor layer on the substrate, a first insulating layer on the first oxide semiconductor layer, and a first gate electrode on the first insulating layer, a second transistor including a second oxide semiconductor layer on the substrate, a first insulating layer on the second oxide semiconductor layer, and a second gate electrode on the first insulating layer, and a third transistor including a third oxide semiconductor layer on the substrate, a first insulating layer on the third oxide semiconductor layer, a second insulating layer on the first insulating layer, and a third gate electrode on the second insulating layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing description and the following description of the present disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this disclosure, illustrate aspects and embodiments of the disclosure and together with the description serve to explain the principles of the disclosure.

Figure 1:
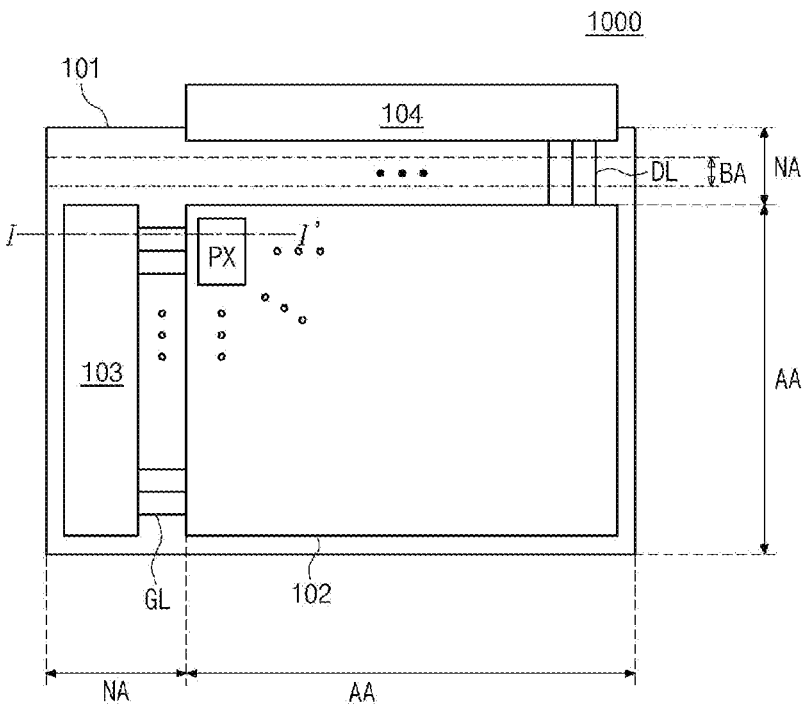
FIG. 1 illustrates a display apparatus according to an embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction of thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Advantages and features of the present disclosure, and implementation methods thereof, are clarified through the example embodiments described with reference to the accompanying drawings. The present disclosure may, however, be embodied in different forms and should not be construed as limited to the example embodiments set forth herein. Rather, these example embodiments are examples and are provided so that this disclosure may be thorough and complete to assist those skilled in the art to fully understand the present disclosure without limiting the protected scope of the present disclosure. The shapes, sizes, areas, ratios, angles, numbers, and the like disclosed in the drawings for describing various embodiments of the present disclosure are merely an example, and thus, the present disclosure is not limited to the illustrated details. Like reference numerals refer to like elements throughout.

Where the term "comprise," "have," "include," "contain," "constitute," "make up of," "formed of," or the like is used, one or more other elements may be added unless the term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompasses all the meanings of the term "can."

In describing a positional relationships, where the positional relationship of two parts is described, for example, using "on," "over," "under," "above," "below," "beneath," "near," "close to," or "adjacent to," "beside," "next to," or the like, one or more other parts may be located between such two parts unless a more limiting teem, such as "immediate(ly)," "direct(ly)," or "close(ly)," is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," and "before," "preceding," "prior to," or the like a case that is not consecutive or not sequential may be included unless a more limiting term, such as "just," "immediate(ly)," or "direct(ly)" is used.

It will be understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing components of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element is "connected," "coupled," "attached," or "adhered" to another element or layer the element or layer can not only be directly connected, coupled, attached, or adhered to another element or layer, but also be indirectly connected, coupled, attached, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two. In one or more aspects, the phrases "one or more among" and "one or more of" may be used interchangeably simply for convenience unless stated otherwise.

In the present disclosure, a "display apparatus" may include a display apparatus in narrow sense, such as a liquid crystal module (LCM), an organic light emitting display module (OLED module), a quantum dot (QD) module or the like, including a display panel and a driving part for driving the display panel. Furthermore, the "display apparatus" may include a complete product or final product which is a notebook computer, a television, a computer monitor, an automotive apparatus or equipment display apparatus including other type of vehicle, or a set electronic apparatus or set device or set apparatus such as a mobile electronic device which is a smart phone, an electronic pad or the like, including the LCM, OLED module, the QD module or the like.

Therefore, the display apparatus of the present disclosure may include a display apparatus in narrow sense itself such as the LCM, OLED module, QD module or the like, and/or an application product or a set device that is an end-user device, including the LCM, OLED module, QD module or the like.

Further, in some embodiments of the present disclosure, the LCM, OLED module, QM module or the like configured with a display panel and a driving part may be expressed as a "display apparatus" in narrow sense, and an electronic apparatus as a final product including the LCM, OLED module, QM module or the like may be distinguished and expressed as a "set apparatus." For example, the display apparatus in narrow sense may include a liquid crystal, organic light emitting diode (OLED) or quantum dot display panel, and a source PCB that is a control part for driving the display panel. The set device may further include a set PCB which is a set control part electrically connected to the source PCB to drive the entire set apparatus.

The display panel used in embodiments of the present disclosure may use all kinds of display panels such as a liquid crystal display panel, an organic light emitting diode (OLED) display panel, a quantum dot (QD) display panel and an electro-luminescent display panel, but embodiments are not limited thereto. The display panel of this disclosure is not limited to a specific display panel capable of bezel bending with a flexible substrate and a lower back plate supporting structure for an organic light emitting diode (OLED) display panel. The display panel applied to the display apparatus according to embodiments of the present disclosure is not limited to a shape or size of the display panel.

For example, if the display panel is an organic light emitting (OLED) display panel, it may include a plurality of gate lines and data lines, and pixels formed at intersections of the gate lines and/or data lines. In addition, the display panel may be configured to include an array including a thin film transistor as an element for selectively applying a voltage to each pixel, a light emitting element layer on the array, and an encapsulation substrate or an encapsulation layer disposed on the array to cover the light emitting element layer. The encapsulation layer can protect the thin film transistor and the light emitting element layer from an external impact, and may prevent penetration of moisture or oxygen into the light emitting element layer. In addition, a layer formed on the array can include an inorganic light emitting layer, for example, a nano-sized material layer or quantum dots.

Features of various embodiments of the present disclosure can be partially or wholly combined with each other, and may be variously inter-operated, linked or driven together. Embodiments of the present disclosure may be carried out independently from each other, or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

FIG. 1 illustrates a display apparatus according to an embodiment of the present disclosure.

The display apparatus 1000 according to an embodiment of the present disclosure may include a display panel 102. The display panel 102 may include a display area AA and a non-display area NA disposed around the display area AA, on a substrate 101.

The substrate 101 may be formed of a plastic material having flexibility to enable bending. For example, the substrate 101 may include one of polyimide (PI), polyethylene terephthalate (PET), polyethylene naphthalate (PEN), polycarbonate (PC), polyethersulfone (PES), polyarylate (PAR), polysulfone (PSF), cyclo-olefin copolymer (COC) or the like, but embodiments of the present disclosure are not limited thereto. For example, glass is not excluded as a material of the substrate 101. In another embodiment of the present disclosure, the substrate 101 may include a semiconductor material such as a silicon wafer.

The display area AA may be an area where a plurality of sub-pixels PX are disposed to display an image. Each of the plurality of sub-pixels PX may be an individual unit emitting light. An emitting element and a driving circuit may be disposed in each of the plurality of sub-pixels PX. For example, a display element for displaying an image and a circuit part for driving the display element may be disposed in the plurality of sub-pixels PX. For example, when the display apparatus 1000 is an organic light emitting display apparatus, the display element may include an organic light emitting element, and when the display apparatus 1000 is a liquid crystal display apparatus, the display element may include a liquid crystal element. The plurality of sub-pixels PX may include a red sub-pixel PX, a green sub-pixel PX and a blue sub-pixel PX, and optionally a white sub-pixel PX, but embodiments of the present disclosure are not limited thereto.

The non-display area NA may be an area where an image is not displayed. The non-display area NA may be an area where various wires (or lines) and driving ICs for driving the plurality of sub-pixels PX disposed in the display area AA are disposed. For example, at least one of a data driving part 104 and a gate driving part 103 may be disposed in the non-display area NA, but embodiments of the present disclosure are not limited thereto.

The non-display area NA may be an area surrounding the display area AA. For example, the non-display area NA may be around the display area AA. For example, the non-display area NA may be an area extending from the display area AA or may be an area in which the plurality of sub-pixels PX are not disposed, but embodiments of the present disclosure are not limited thereto. The non-display area NA where no image is displayed may be a bezel area or may further include a bending area BA where the substrate 101 is bent, but embodiments of the present disclosure are not limited thereto.

A plurality of data lines DL and a plurality of gate lines GL may be disposed in the display area AA. For example, the plurality of data lines DL may be arranged in rows or columns, and the plurality of gate lines GL may be arranged in columns or rows. The sub-pixel PX may be disposed in an area formed by the data line DL and/or the gate line GL.

The sub-pixel PX of the display area AA may include a thin film transistor or a transistor formed of a semiconductor layer. For example, the thin film transistor or the transistor formed of the semiconductor layer may include an oxide semiconductor material, but embodiments of the present disclosure are not limited thereto. For example, the thin film transistor may be a transistor, but is not limited to a term.

According to an embodiment of the present disclosure, the gate driving part 103 including a gate driving circuit may be disposed in the non-display area NA. The gate driving circuit of the gate driving part 103 may sequentially supply scan signals to the plurality of gate lines GL to sequentially drive each pixel row of the display area AA. For example, the pixel row may be a row formed by pixels connected to one gate line. The gate driving circuit may also be referred to as a scan driving circuit, but is not limited to a term.

The gate driving circuit may be formed of a thin film transistor having a polycrystalline semiconductor layer, may be formed of a thin film transistor having an oxide semiconductor layer, or may be formed of a pair of a thin film transistor having a polycrystalline semiconductor layer and a thin film transistor having an oxide semiconductor layer. When the same semiconductor material is used for the thin film transistors disposed in the non-display area NA and the display area AA, the transistors may be simultaneously formed by a same process, but embodiments of the present disclosure are not limited thereto.

The gate driving circuit may include a shift register, a level shifter, and the like.

As in the display apparatus according to an embodiment of the present disclosure, the gate driving circuit may be implemented in a gate in panel (GIP) form and directly disposed on the substrate 101.

The gate driving part 103 including the gate driving circuit may sequentially supply scan signals of an on voltage or an off voltage to the plurality of gate lines GL.

The gate driving part 103 according to an embodiment of the present disclosure may be directly formed on the substrate 101 using a thin film transistor using a polycrystalline semiconductor material as a semiconductor layer, or may be formed by configuring a C-MOS with a thin film transistor using a polycrystalline semiconductor material as a semiconductor layer and a thin film transistor using an oxide semiconductor material as a semiconductor layer.

A thin film transistor having an oxide semiconductor layer and a thin film transistor having a polycrystalline semiconductor layer have high electron mobility in a channel thereof, and may implement high resolution and low power consumption.

The display apparatus 1000 according to an embodiment of the present disclosure may further include the data driving part 104 including a data driving circuit. When a gate line GL is selected by the gate driving part 103 including the gate driving circuit, the data driving circuit of the data driving part 104 may convert an image data of a digital type into analog data voltages and supply the data voltage to the plurality of data lines DL.

The plurality of gate lines GL disposed at the substrate 101 may include a plurality of scan lines and a plurality of emission control lines or the like. The plurality of scan lines and the plurality of emission control lines may be wires that transmit different types of gate signals (e.g., scan signals and emission control signals) to gate nodes of different types of transistors (e.g., scan transistors and emission control transistors).

The gate driving part 103 including the gate driving circuit may include a scan driving circuit that outputs scan signals to the plurality of scan lines, which are one type of gate lines GL, and an emission driving circuit that outputs emission control signals to the plurality of emission control lines which are another type of gate lines GL.

The display panel 102 according to an embodiment of the present disclosure may further include the bending area BA where the substrate 101 is bent. The bending area BA may be an area where the substrate 101 is bent. The substrate 101 may be maintained in a flat state except for the bending area BA.

The data line DL may be disposed to pass through the bending area BA, and various data lines DL may be disposed and connected to the data pads.

Figure 2:
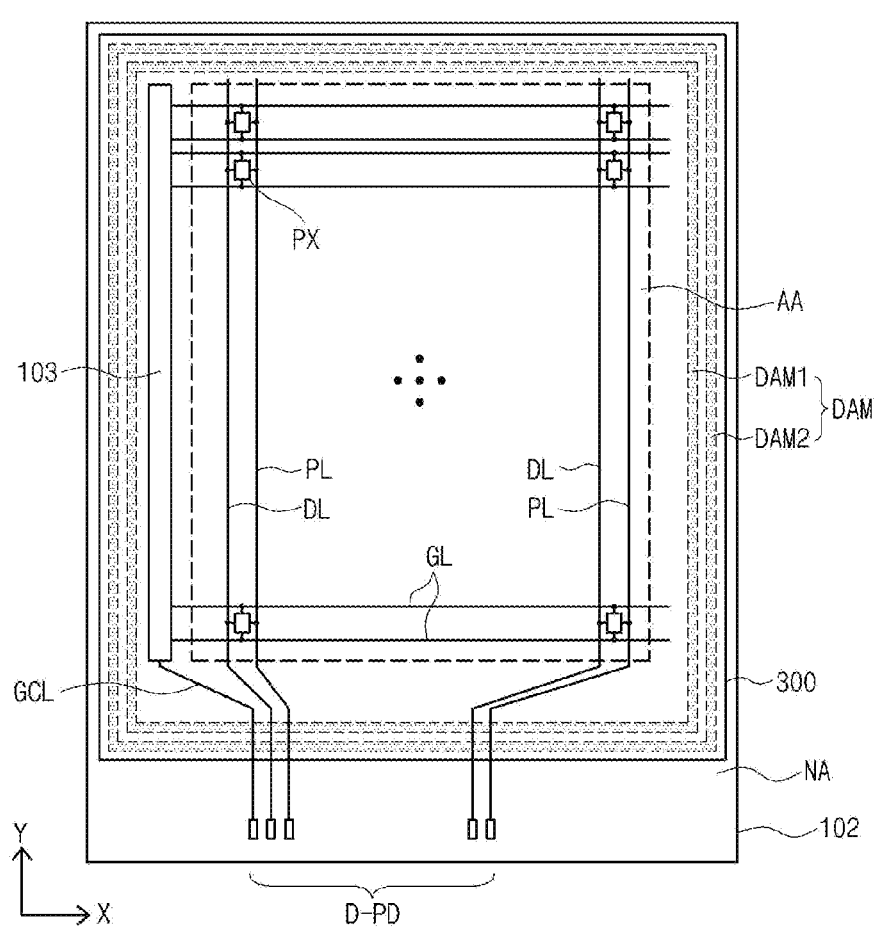
FIG. 2 is a plan view illustrating a display apparatus according to an embodiment of the present disclosure.
Figure 3:
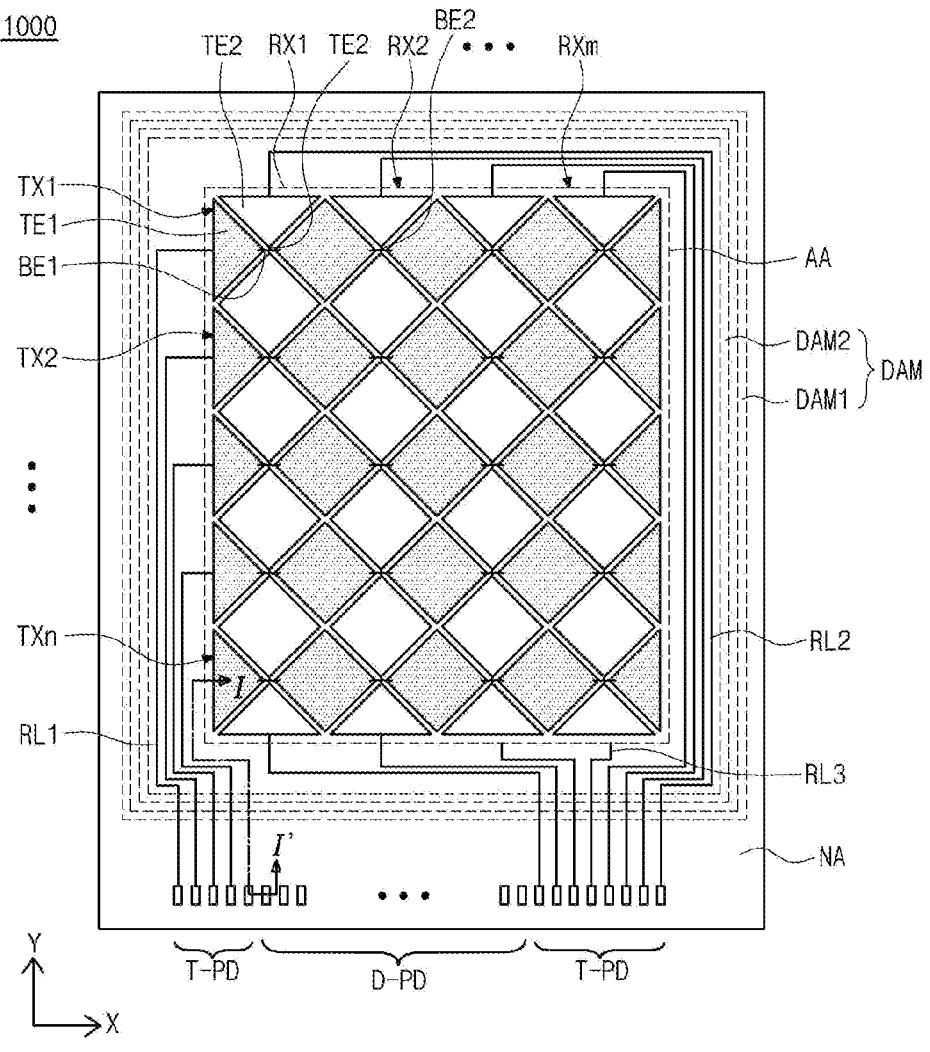
FIG. 3 is a plan view illustrating a display apparatus according to an embodiment of the present disclosure.

FIGS. 2 and 3 illustrates a display apparatus according to an embodiment of the present disclosure.

Referring to FIGS. 2 and 3, the display apparatus 1000 according to an embodiment of the present disclosure may include the display area AA and the non-display area NA. The display area AA may have image display and touch sensing functions. The non-display area NA may be located outside the display area AA. The display area AA may be expressed as an active area, a pixel matrix area, or a touch sensing area, but is not limited to a term. The non-display area NA may be expressed as a bezel area, a non-active area, or a touch non-sensing area, but is not limited to a term.

The display apparatus 1000 according to an embodiment of the present disclosure may include a display panel 102 and an encapsulation part 300.

The display panel 102 may be configured to display an image. For example, the display panel 102 may include a circuit element layer including a plurality of thin film transistors (TFTs) and an emitting element layer including a plurality of emitting elements, for image display. The encapsulation part 300 may be disposed to seal (or encapsulate) the emitting element layer on the display panel 102. A touch part having a touch sensing function may be disposed over the encapsulation part 300 with a buffer layer therebetween. The buffer layer may have a relatively large thickness and be formed of an organic material, but embodiments of the present disclosure are not limited thereto. An end portion of the buffer layer and an end of the encapsulation part 300 may be arranged in a stepped shape to have an end profile of a stepped shape, but embodiments of the present disclosure are not limited thereto. In addition, the display apparatus 1000 may further include an optically functional film including a polarizing film, an optically cleared adhesive (OCA), a cover substrate, a protective film (or protective layer), and the like, on the touch part, but embodiments of the present disclosure are not limited thereto.

A pixel array including the plurality of sub-pixels PX for displaying an image and a plurality of first signal lines may be disposed in the display area AA of the display panel 102. The plurality of sub-pixels PX may include a red sub-pixel, a green sub-pixel, and a blue sub-pixel, and may further include a white sub-pixel for luminance enhancement, but embodiments of the present disclosure are not limited thereto.

Each of the plurality of sub-pixel PX may be connected to a plurality of first signal lines including the gate line GL, the data line DL, and a power line PL. Each of the plurality of sub-pixel PX may include an emitting element and a pixel circuit independently driving the emitting element. As the emitting element, an organic light emitting diode, a quantum-dot light emitting diode, or an inorganic light emitting diode may be applied, but embodiments of the present disclosure are not limited thereto. Hereinafter, an organic light emitting diode is described as an example.

A circuit element layer including a plurality of signal lines connected to the display area AA and a plurality of pads D-PD may be disposed in the non-display area NA of the display panel 102. The signal lines of the non-display area NA may include link lines, power supply lines and the like respectively connected to the plurality of first signal lines (GL, DL, PL, and the like) of the display area AA. The plurality of pads D-PD for connecting the plurality of second signal lines of the non-display area NA and a pixel driving part may be disposed in a pad area provided on one side (or part) of the non-display area NA. The display panel 102 may include a lower pad among the plurality of pads D-PD, and may have a structure connected to an upper pad disposed on the touch part to be described later.

The gate driving part 103 driving the plurality of gate lines GL of the display area AA may be disposed on one portion or both portions of the non-display area NA of the display panel 102. The gate driving part 103 including one or more thin film transistors may be formed at the circuit element layer together with the thin film transistors of the display area AA. The gate driving part 103 may receive control signals from a driving part through the signal lines GCL and the pads D-PD disposed in the non-display area NA.

The driving part may be mounted on the pad area where the pads D-PD are disposed, or may be mounted on a circuit film, and may be connected to the pads D-PD through an anisotropic conductive film, but embodiments of the present disclosure are not limited thereto. The circuit film may be any one of COF (Chip On Film), FPC (Flexible Printed Circuit), and FFC (Flexible Flat Cable), but embodiments of the present disclosure are not limited thereto. The driving part may include a timing controller, a gamma voltage generating part, and a data driving part, but embodiments of the present disclosure are not limited thereto.

The encapsulation part 300 disposed on the display panel 102 may overlap an entire of the display area AA. The encapsulation part 300 may be disposed to extend into the non-display area NA and overlap a dam part DAM disposed in the non-display area NA. The encapsulation part 300 may seal and protect the emitting elements of the display panel 102. For example, the encapsulation part 300 may protect the emitting element by blocking moisture and oxygen penetration. For example, the encapsulation part 300 may include a laminated structure of at least one or more inorganic encapsulation layers and at least one or more organic encapsulation layers that blocks inflow or flow of particles, but embodiments of the present disclosure are not limited thereto. The encapsulation part 300 may have a structure in which an organic encapsulation layer having a thickness large enough to sufficiently cover particles is disposed between inorganic encapsulation layers having a small thickness. The organic encapsulation layer may be a particle cover layer (PCL), but is not limited to a term.

The dam part DAM may be disposed in the non-display area NA. The dam part DAM may restrain an end portion of the organic encapsulation layer of the encapsulation part 300 and thus prevent the organic encapsulation layer from flowing down or collapsing. For example, the dam part DAM may include a plurality of dams DAM1 and DAM2. For example, the dam part DAM may surround an area including the display area AA and the gate driving part 103 of the display panel 102. For example, the dam part DAM may have a closed loop shape, but embodiments of the present disclosure are not limited thereto.

The touch part may be disposed on the encapsulation part 300. The touch part may use a capacitance method in which a signal reflecting a capacitance change amount due to a user's touch is provided to the touch driving part. The touch part may use a self-capacitance method in which a signal reflecting a capacitance change of each touch electrode is independently provided to the touch driving part, or a mutual capacitance method in which a signal reflecting a capacitance change amount between first and second touch electrodes is provided to the touch driving part, but embodiments of the present disclosure are not limited thereto.

Since each of a plurality of touch electrodes constituting the touch part of the self-capacitance method includes a capacitance formed on the touch electrode itself, it can be used as a self-capacitance type touch sensor that detects a change in capacitance due to the user's touch. Each of the plurality of touch electrodes may be individually connected to a plurality of touch lines. For example, each of the plurality of touch electrodes may be electrically connected to one of a plurality of touch lines crossing the touch electrodes and electrically insulated from the other touch lines. For example, a $m^{th}$ touch electrode (where m is a natural number) may be electrically connected to a $m^{th}$ touch line through at least one touch contact hole, and be electrically insulated from other touch lines except for the $m^{th}$ touch line. A $m+1^{th}$ touch electrode may be electrically connected to a $m+1^{th}$ touch line through at least one touch contact hole and be electrically insulated from other touch lines except for the $m+1^{th}$ touch line. For example, the touch electrode and the touch line may be formed at different layers with a touch insulating layer interposed therebetween and be connected through a contact hole penetrating the touch insulating layer, but embodiments of the present disclosure are not limited thereto.

Hereinafter, a mutual capacitance type touch portion is described as an example.

Referring to FIG. 3, the touch part may be disposed in the display area AA and may include a plurality of touch electrodes TE1 and TE2 and a plurality of connection electrodes BE1 and BE2 providing capacitance type touch sensors. The touch part may include a plurality of touch routing lines RL1, RL2, and RL3 and a plurality of touch pads T-PD disposed in the non-display area NA. When the touch part is formed, upper pads among the pads D-PD may be formed of the same metal material and at the same layer as upper pads of the touch pads T-PD, or may be formed of the same metal material and at the same layer as the touch electrodes TE1 and TE2, but embodiments of the present disclosure are not limited thereto.

The touch part may include a plurality of first touch electrode channels TX1 to TXn and a plurality of second touch electrode channels RX1 to RXm. The plurality of first touch electrode channels TX1 to TXn may be arranged in a first direction (or X-axis direction or horizontal direction) in the display area AA, and the plurality of first touch electrodes TE1 arranged in the first direction are electrically connected to each other in the first touch electrode channel. The plurality of second touch electrode channels RX1 to RXm may be arranged in a second direction (or Y-axis direction or vertical direction) in the display area AA, and the plurality of second touch electrodes TE2 arranged in the second direction are electrically connected to each other. Adjacent first and second touch electrodes TE1 and TE2 may configure each touch sensor of a mutual capacitance type.

Each of the first touch electrodes TE1 arranged in the first direction X in each first touch electrode channel TXi (i=1, . . . , n) may be connected to the adjacent first touch electrode TE1 through the first connection electrode BE1. Each of the second touch electrodes TE2 arranged in the second direction Y in each second touch electrode channel RXi (i=1, . . . , m) may be connected to the adjacent second touch electrode TE2 through the second connection electrode BE2. For example, the first touch electrode TE1 may be a transmission (Tx) electrode, but is not limited to a term. For example, the second touch electrode TE2 may be a receiving (Rx) electrode, but is not limited to a term. The plurality of first touch electrode channels TX1 to TXn may be transmission channels, but are not limited to a term. The plurality of second touch electrode channels RX1 to RXm may be receiving channels or read-out channels, but are not limited to a term. Each of the first and second touch electrodes TE1 and TE2 may have a diamond shape, but embodiments of the present disclosure are not limited thereto. For example, each of the first and second touch electrodes TE1 and TE2 may have various polygonal shapes.

The plurality of touch routing lines RL1, RL2, and RL3 and the plurality of touch pads T-PD may be disposed in the non-display area NA of the touch part. The plurality of touch routing lines RL1, RL2, and RL3 may be connected to the touch electrode channels TX1 to TXn and RX1 to RXm of the display area AA. The plurality of touch pads T-PD may be connected to the plurality of touch routing lines RL1, RL2, and RL3. The plurality of touch routing lines RL1, RL2, and RL3 may overlap the encapsulation part 300 in the non-display area NA surrounding the display area AA. The touch driving part may be mounted on a circuit film and may be connected to the plurality of touch pads T-PD disposed in the non-display area NA through an anisotropic conductive film, but embodiments of the present disclosure are not limited thereto.

One portions of each of the plurality of first touch electrode channels TX1 to TXn disposed in the display area AA may be connected to the touch driving part through the plurality of first touch routing lines RL1 and the touch pads T-PD disposed in the non-display area NA. The plurality of first touch routing lines RL1 may be individually connected to the plurality of touch pads T-PD disposed in the lower region of non-display area NA via either one of the left and right non-display areas NA and the lower region of the non-display area NA.

Both portions of each of the plurality of second touch electrode channels RX1 to RXm disposed in the display area AA may be connected to the touch driving part through the plurality of second touch routing lines RL2, the plurality of third touch routing lines RL3 and the touch pads T-PD disposed in the non-display area NA. Since the plurality of second touch electrode channels RX1 to RXm, which may be used as read-out channels, are longer than the first touch electrode channels TX1 to TXn, both portions of each second touch electrode channel RXi may be connected to the touch driving part through the second and third touch routing lines RL2 and RL3 to reduce RC delay and improve touch sensing performance.

For example, the plurality of second touch routing lines RL2 may be connected to one portion of the second touch electrode channels RX1 to RXm in the upper region of the non-display area NA and may be individually connected to the plurality of touch pads T-PD in the lower region of the non-display area NA via the other one of the left and right region of the non-display areas NA and the lower region of the non-display area NA. The plurality of third touch routing lines RL3 may be connected to the other portion (or the other end) of the second touch electrode channels RX1 to RXm in the lower region of the non-display area NA and may be individually connected to the plurality of touch pads T-PD disposed in the lower region of the non-display area NA via the lower region of the non-display area NA.

The touch driving part may drive the plurality of first touch electrode channels TX1 to TXn, receive read-out signals output from the plurality of second touch electrode channels RX1 to RXm, and generate touch sensing data using the read-out signals. For example, the touch driving part may compare read-out signals of two adjacent channels through a differential amplifier to generate a touch sensing signal indicating presence of a touch, and may digitally convert the touch sensing signal into a touch sensing data and output the touch sensing data to the touch controller. The touch controller may detect touch coordinates of the touch area based on the touch sensing data and provide the detected touch coordinates to a host system.

The touch part according to an embodiment of the present disclosure may be disposed over the encapsulation part 300 with a buffer layer similar to the encapsulation part 300 interposed therebetween in the display area AA. Accordingly, manufacturing costs can be reduced by simplifying manufacturing processes compared to a method of attaching a touch panel, and touch sensing performance can be improved by reducing parasitic capacitance between the touch part and the display panel 102, so that reliability of the display apparatus 1000 may be improved.

Since the end portion of the buffer layer of the touch portion and the end portion of the encapsulation part are arranged in a stepped shape, the end portion of the buffer layer of the touch part and the end portion of the encapsulation part may have a stepped profile. The touch routing lines RL1, RL2, and RL3 may be disposed along the stepped ends of the buffer layer and the encapsulation part 300. For example, each of the touch routing lines RL1, RL2, and RL3 may include a lower routing line disposed along the end portion of the encapsulation part 300, and an upper routing line disposed along the end of the buffer layer and connected to the lower routing line through a contact hole on the end portion of the encapsulation part 300. Accordingly, the touch routing lines RL1, RL2, and RL3 may be stably formed in the stepped end portion of the organic buffer layer and the encapsulation part 300 without disconnection defects, so that a yield of the display apparatus 1000 and a reliability of the display apparatus 1000 may be improved.

Figure 4:
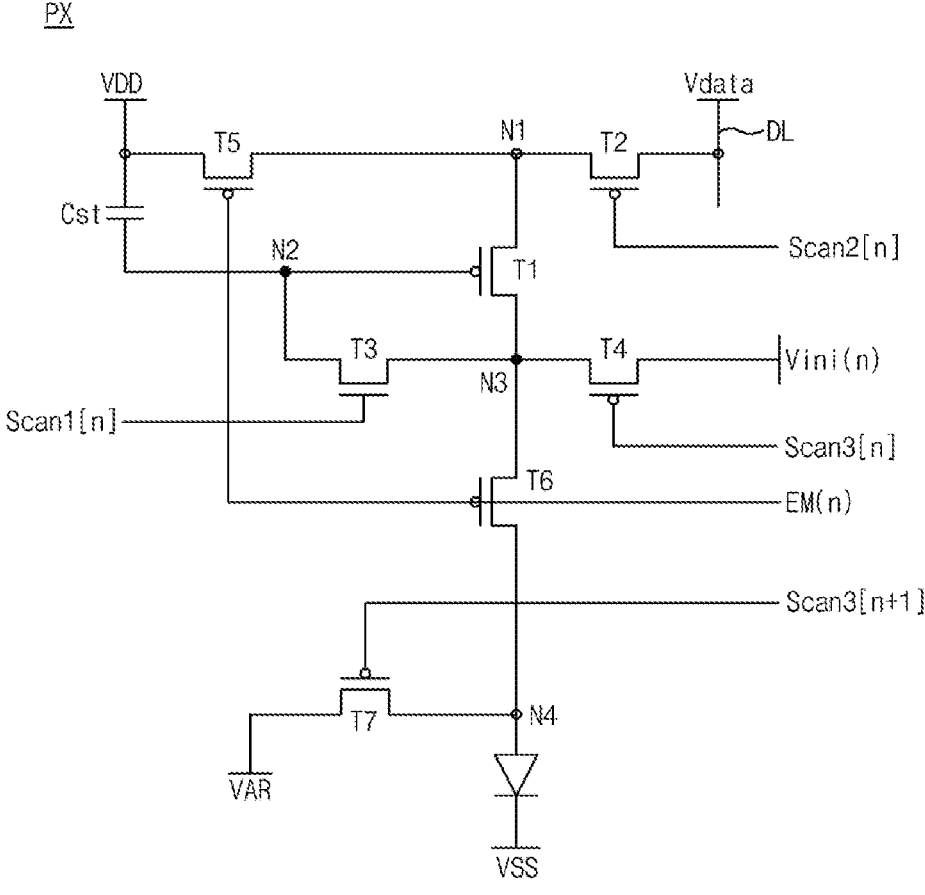
FIG. 4 illustrates a pixel driving circuit of a display apparatus according to an embodiment of the present disclosure.

FIG. 4 illustrates a pixel driving circuit of a display apparatus according to an embodiment of the present disclosure.

FIG. 4 shows a driving circuit that includes seven thin film transistors and one storage capacitor, but embodiments of the present disclosure are not limited thereto. For example, the present disclosure is not limited to the embodiment of FIG. 4 and may be applied to internal compensation circuits of various configurations. One of the seven thin film transistors may be a driving thin film transistor and the rest may be switching thin film transistors for internal compensation. For example, it may be configured with six thin film transistors and one storage capacitor.

Referring to FIG. 4, each sub-pixel PX may include an emitting element and a pixel circuit.

The emitting element may emit light by a driving current supplied from a first transistor T1. A plurality of organic layers may be disposed between an anode electrode and a cathode electrode of the emitting element. The organic layer may include at least one or more a hole transfer layer, an electron transfer layer, and an emitting layer. The hole transfer layer may be a layer that injects or transports holes into the emitting layer. For example, the hole transfer layer may be a hole injection layer, a hole transport layer, and an electron blocking layer, but embodiments of the present disclosure are not limited thereto. The electron transfer layer may be a layer that injects or transports electrons into the emitting layer. For example, the electron transfer layer may be an electron transport layer, an electron injection layer, and a hole blocking layer, but embodiments of the present disclosure are not limited thereto. The anode electrode of the emitting element may be connected to a fourth node N4, and the cathode electrode of the emitting element may be connected to a wire (or a line) provided with a low potential driving voltage VSS.

The first transistor T1 may control the driving current applied to the emitting element according to a source-gate voltage Vsg between a source electrode and a gate electrode. The first transistor T1 may be a p-type MOSFET (i.e., PMOS), or may be implemented as a low-temperature polycrystalline silicon (LTPS) transistor, but embodiments of the present disclosure are not limited thereto. In another embodiment of the present disclosure, the first transistor T1 may be an n-type MOSFET (i.e., NMOS), or may be implemented as an oxide transistor, but embodiments of the present disclosure are not limited thereto. A source electrode of the first transistor T1 may be connected to a first node N1, a gate electrode of the first transistor T1 may be connected to a second node N2, and a drain electrode of the first transistor T1 may be connected to a third node N3. The first transistor T1 may be a driving transistor, but embodiments of the present disclosure are not limited thereto.

An n-type thin film transistor (or n-type transistor) may be an oxide transistor which is formed by using an oxide semiconductor material for a semiconductor layer. For example, the oxide transistor may be a transistor having a channel which is formed from an oxide semiconductor material such as indium oxide, gallium oxide, zinc oxide, or IGZO, but embodiments of the present disclosure are not limited thereto.

A p-type thin film transistor (or p-type transistor) may be a polycrystalline transistor which is formed by using a semiconductor such as silicon for a semiconductor layer. For example, the polycrystalline transistor may be a LTPS or low-temperature poly-silicon transistor, and may be a transistor having a poly-silicon channel formed using a low-temperature process, but embodiments of the present disclosure are not limited thereto.

A second transistor T2 may apply a data voltage Vdata supplied from the data line DL to the first node N1 which is a source electrode of the first transistor T1. For example, the second transistor T2 may be configured to switch an electrical connection between the first node N1 of the first transistor T1 and the data line DL. The second transistor T2 may be a p-type MOSFET (i.e., PMOS) or may be implemented as a LTPS transistor, but embodiments of the present disclosure are not limited thereto. In another embodiment of the present disclosure, the second transistor T2 may be an n-type MOSFET (i.e., NMOS) or may be implemented as an oxide transistor, but the embodiments of the present disclosure are not limited thereto. The second transistor T2 may include a source electrode connected to the data line DL, a drain electrode connected to the first node N1, and a gate electrode connected to a second scan signal line transmitting a second scan signal Scan2(n). Accordingly, in response to a low-level second scan signal Scan2(n) which is a turn-on voltage, the second transistor T2 may apply the data voltage Vdata supplied from the data line DL to the first node N1 which is the source of the first transistor T1. The second transistor T2 may be a switching transistor, but embodiments of the present disclosure are not limited thereto.

A third transistor T3 may diode-connect the gate electrode and the drain electrode of the first transistor T1. For example, the third transistor T3 may be electrically connected between the second node N2 and the third node N3 of the first transistor T1. The third transistor T3 may be an n-type MOSFET (i.e., NMOS) or implemented as an oxide transistor to minimize a leakage current during a turn-off period, but embodiments of the present disclosure are not limited thereto. In another embodiment of the present disclosure, the third transistor T3 may be a p-type MOSFET (i.e., PMOS) or may be implemented as an LTPS transistor, but embodiments of the present disclosure are not limited thereto. The third transistor T3 may include a drain electrode or source electrode connected to the third node N3, a source electrode or drain electrode connected to the second node N2, and a gate electrode connected to a first scan signal line transmitting a first scan signal Scan1($n$). Accordingly, in response to a high-level first scan signal Scan1($n$) which is a turn-on voltage, the third transistor T3 may diode-connect the gate electrode and the drain electrode of the first transistor T1. The third transistor T3 may be a switching transistor or a sampling transistor, but embodiments of the present disclosure are not limited thereto.

A fourth transistor T4 may apply an initialization signal (or initialization voltage) Vini(n) to the third node N3 that is the drain electrode of the first transistor T1. For example, the fourth transistor T4 may be configured to switch an electrical connection between the third node N3 of the first transistor T1 and an initialization signal line or initialization voltage line. The fourth transistor T4 may be a p-type MOSFET (i.e., PMOS) or may be implemented as an LTPS transistor, but embodiments of the present disclosure are not limited thereto. In another embodiment, the fourth transistor T4 may be an n-type MOSFET (i.e., NMOS) or may be implemented as an oxide transistor, but embodiments of the present disclosure are not limited thereto. The fourth transistor T4 may include a source electrode connected to the initialization signal line transmitting the initialization signal Vini(n), a drain electrode connected to the third node N3, and a gate electrode connected to a third scan signal line transmitting a third scan signal Scan3($n$). Accordingly, in response to a low-level third scan signal Scan3($n$) which is a turn-on voltage, the fourth transistor T4 may apply the initialization signal Vini(n) to the third node N3 which is the drain electrode of the first transistor T1. The fourth transistor T4 may be a switching transistor or a sampling transistor, but embodiments of the present disclosure are not limited thereto.

A fifth transistor T5 may apply a high potential driving voltage VDD to the first node N1 that is the source electrode of the first transistor T1. For example, the fifth transistor T5 may be configured to switch an electrical connection between the first node N1 of the first transistor T1 and the high potential driving voltage line. The fifth transistor T5 may be a p-type MOSFET (i.e., PMOS) or may be implemented as an LTPS transistor, but embodiments of the present disclosure are not limited thereto. In another embodiment of the present disclosure, the fifth transistor T5 may be an n-type MOSFET (i.e., NMOS) or may be implemented as an oxide transistor, but embodiments of the present disclosure are not limited thereto. The fifth transistor T5 may include a source electrode connected to the high potential driving voltage line transmitting the high potential driving voltage VDD, a drain electrode connected to the first node N1, and a gate electrode connected to an emission signal line transmitting an emission signal EM(n). Accordingly, in response to a low-level emission signal EM(n) which is a turn-on voltage, the fifth transistor T5 may apply the high potential driving voltage VDD to the first node N1 which is the source electrode of the first transistor T1. The fifth transistor T5 may be a switching transistor, but embodiments of the present disclosure are not limited thereto.

A sixth transistor T6 may form a current path between the first transistor T1 and the emitting element. For example, the sixth transistor T6 may be configured to switch an electrical connection between the third node N3 of the first transistor T1 and a first electrode of the emitting element. The sixth transistor T6 may be a p-type MOSFET (i.e., PMOS) or may be implemented as an LTPS transistor, but embodiments of the present disclosure are not limited thereto. In another embodiment, the sixth transistor T6 may be an n-type MOSFET (i.e., NMOS) or may be implemented as an oxide transistor, but embodiments of the present disclosure are not limited thereto. The sixth transistor T6 may include a source electrode connected to the third node N3, a drain electrode connected to the fourth node N4, and a gate electrode connected to the emission signal line transmitting the emission signal EM(n). In response to the emission signal EM(n), the sixth transistor T6 may form a current path between the third node N3 which is the source electrode of the sixth transistor T6, and the fourth node N4 which is the drain electrode of the sixth transistor T6. Accordingly, in response to a low-level emission signal EM(n) which is a turn-on voltage, the sixth transistor T6 may form a current path between the first transistor T1 and the emitting element. The sixth transistor T6 may be a switching transistor or a sampling transistor, but embodiments of the present disclosure are not limited thereto.

A seventh transistor T7 may apply a reset voltage VAR to the fourth node N4 that is the anode electrode of the emitting element. For example, the seventh transistor T7 may be configured to switch an electrical connection between the first electrode of the emitting element and a reset voltage line. The seventh transistor T7 may be a p-type MOSFET (i.e., PMOS) or may be implemented as an LTPS transistor, but embodiments of the present disclosure are not limited thereto. In another embodiment of the present disclosure, the seventh transistor T7 may be an n-type MOSFET (i.e., NMOS) or may be implemented as an oxide transistor, but embodiments of the present disclosure are not limited thereto. The seventh transistor T7 may include a source electrode connected to the reset voltage line transmitting the reset voltage VAR, a drain electrode connected to the fourth node N4, and a gate electrode connected to a third scan signal line transmitting a third scan signal Scan3($n$+1). Accordingly, in response to the third scan signal Scan3($n$+1) that has a low level as a turn-on level and is provided to a $(n+1)^{th}$ pixel line, the seventh transistor T7 may apply the reset voltage VAR to the fourth node N4 which is the anode electrode of the emitting element. The seventh transistor T7 may be a switching transistor, but embodiments of the present disclosure are not limited thereto.

The storage capacitor Cst may maintain the data voltage Vdata stored in each sub-pixel PX for one frame. For example, the storage capacitor Cst may be configured to apply a voltage corresponding to the data voltage Vdata to the gate of the first transistor T1 for one frame period. The storage capacitor Cst may include a first electrode connected to the second node N2 and a second electrode connected to the high potential driving voltage line transmitting the high potential driving voltage VDD. For example, one electrode of the storage capacitor Cst may be connected to the gate electrode of the first transistor T1 and the other electrode of the storage capacitor Cst may be connected to the high potential driving voltage line transmitting the high potential driving voltage VDD.

The emitting element may include a light emitting diode

The high potential driving voltage line and the low potential driving voltage line may be common voltage lines commonly connected to the plurality of sub-pixels PX disposed in the display panel 102, but embodiments of the present disclosure are not limited to this.

The display apparatus according to an embodiment of the present disclosure is described as an example in which the third transistor T3 included in the sub-pixel are n-type transistors, but embodiments of the present disclosure are not limited thereto. For example, the second transistor T2 may be n-type, but embodiments of the present disclosure are not limited thereto.

Figure 5:
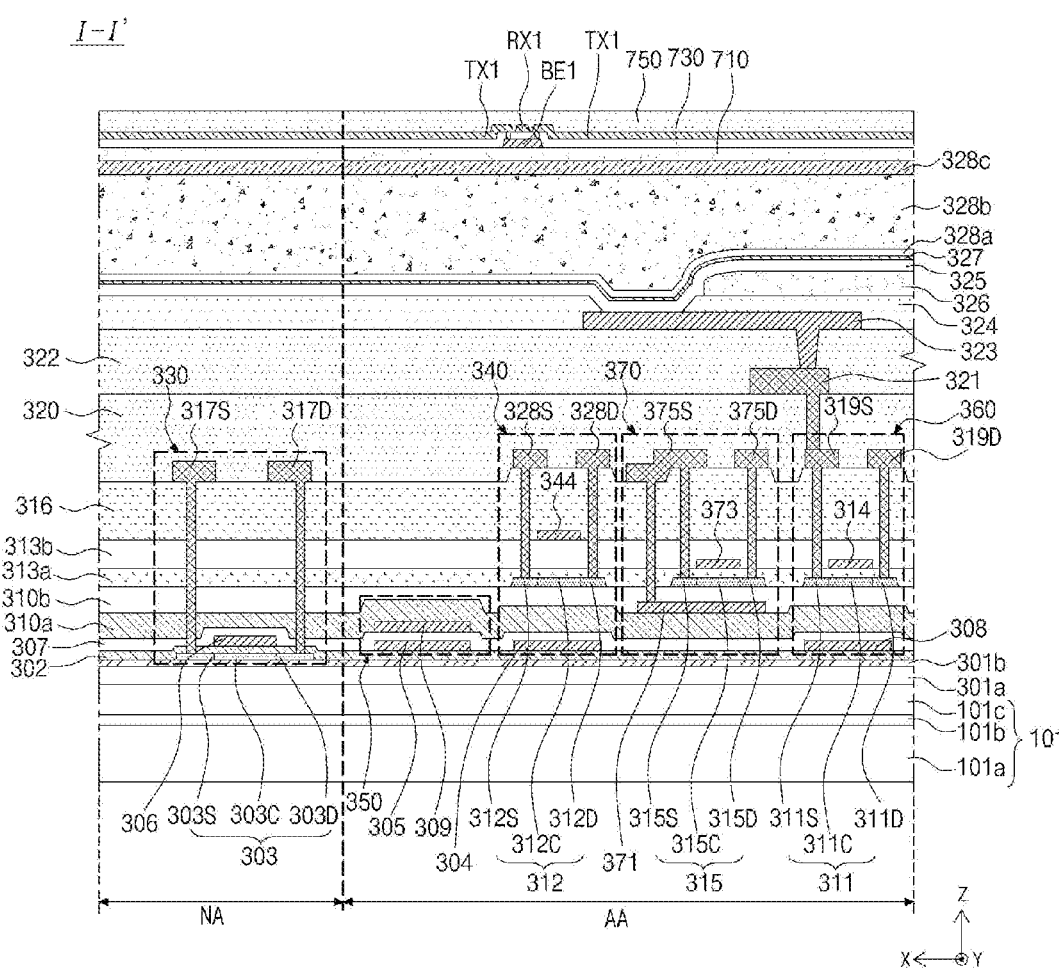
FIG. 5 is a cross-sectional view taken along a line I-I' of FIG. 1 according to an embodiment of the present disclosure.

FIG. 5 is a cross-sectional view taken along a line I-I' of FIG. 1 according to an embodiment of the present disclosure.

Referring to FIG. 5, the display apparatus according to an embodiment of the present disclosure may include the display area AA and the non-display area NA. The non-display area NA may be disposed around the display area AA.

The display apparatus may include gate lines and data lines in the display area AA, and a sub-pixel connected to the data line crossing the gate line may be included. The sub-pixel may include an emitting element.

In the display area AA, a first transistor 370, a second transistor 360, and a third transistor 340 may be formed. The first transistor 370 may be the first transistor T1 described in FIG. 4, but embodiments of the present disclosure are not limited thereto. The second transistor 360 may be one of the second transistor T2, the fourth transistor T4, the fifth transistor T5, the sixth transistor T6, and the seventh transistor T7 described in FIG. 4, but embodiments of the present disclosure are not limited thereto. The third transistor 340 may be the third transistor T3 described in FIG. 4, but embodiments of the present disclosure are not limited thereto.

For example, the first transistor 370 may provide a driving current to the emitting element according to a data voltage applied from the data line. The second transistor 360 may control driving of the first transistor 370 according to a gate voltage applied from the gate line. The third transistor 340 may sense a threshold voltage of the first transistor 370 and compensate for a change of the threshold voltage to adjust driving of the first transistor 370. For example, the third transistor 340 may sense the threshold voltage of the first transistor 370 to adjust driving of the first transistor 370.

The display area AA and the non-display area NA may be on the substrate 101. The substrate 101 may be configured with a multi-layered structure in which an organic layer and an inorganic layer are alternately disposed, but embodiments of the present disclosure are not limited thereto. For example, the substrate 101 may be formed by alternately disposing an organic layer such as polyimide and an inorganic layer such as silicon oxide (SiOx). For example, the substrate 101 may include a first layer 101a and a second layer 101c. The first layer 101a and the second layer 101c may be formed of a material such as polyimide (PI), polyethylene terephthalate (PET), polyethylene naphthalate (PEN), polycarbonate (PC), polyethersulfone (PES), polyarylate (PAR), and polysulfone (PSF), or cyclo-olefin copolymer (COC), but embodiments of the present disclosure are not limited thereto. For example, glass may not be excluded as a material for the first layer 101a and the second layer 101c.

The third layer 101b may be disposed between the first layer 101a and the second layer 101c. The third layer 101b may be formed of silicon oxide (SiOx) or silicon nitride (SiNx), but embodiments of the present disclosure are not limited thereto. The third layer 101b may be an insulating layer or an intermediate layer, but is not limited to a term.

A first buffer layer 301a may be disposed on the substrate 101. For example, the first buffer layer 301a may block moisture and the like that may permeate from the outside. The first buffer layer 301a may have one or more layers, but embodiments of the present disclosure are not limited thereto. The first buffer layer 301a may be made of silicon oxide (SiOx) or the like, but embodiments of the present disclosure are not limited thereto. For example, the first buffer layer 301a may have multiple layers of silicon oxide (SiOx) and silicon nitride (SiNx), but embodiments of the present disclosure are not limited thereto. For example, the first buffer layer 301a may be formed by stacking silicon oxide (SiOx) and silicon nitride (SiNx), but embodiments of the present disclosure are not limited thereto. For example, a thickness of silicon oxide (SiOx) of the first buffer layer 301a may be smaller than a thickness of silicon nitride (SiNx) of the first buffer layer 301a, but embodiments of the present disclosure are not limited thereto. For example, the thickness of silicon oxide (SiOx) of the first buffer layer 301a may be 500 Å, and the thickness of silicon nitride (SiNx) of the first buffer layer 301a may be 5,000 Å, but embodiments of the present disclosure are limited thereto. For example, the first buffer layer 301a may be a multi-buffer layer, but is not limited to a term.

A second buffer layer 301b may be disposed on the first buffer layer 301a. The second buffer layer 301b may further protect the emitting element from permeation of a moisture. For example, the second buffer layer 301b may have a single layer of a silicon oxide (SiOx) layer, a silicon nitride (SiNx) layer, or a double layer of a silicon oxide (SiOx) layer and a silicon nitride (SiNx) layer, but embodiments of the present disclosure are not limited thereto. For example, the second buffer layer 301b may be an active buffer layer, and is not limited to a term.

When the first buffer layer 301a includes one or more layers, the second buffer layer 301b may be omitted. For example, at least one or more of the first buffer layer 301a and the second buffer layer 301b may be formed, but embodiments of the present disclosure are not limited thereto.

A first insulating layer 302 may be disposed on the second buffer layer 301b. For example, the first insulating layer 302 may include a single layer of silicon oxide (SiOx) or silicon nitride (SiNx), or a double layer of silicon oxide (SiOx) and silicon nitride (SiNx), but embodiments of the present disclosure are not limited thereto. The first insulating layer 302 may include at least one or more layers, but embodiments of the present specification are not limited thereto. The first insulating layer 302 may be a gate insulating layer, but is not limited to a term.

A second insulating layer 307 may be disposed on the first insulating layer 302. For example, since the second insulating layer 307 is formed of silicon oxide (SiOx) that does not contain hydrogen particles, the second insulating layer 307 may protect at least one or more of a first semiconductor layer 315 of the first transistor 370, a second semiconductor layer 311 of the second transistor 360, and a third semiconductor layer 312 of the third transistor 340 that use an oxide semiconductor layer whose reliability may be damaged by hydrogen particles. For example, the second insulating layer 307 may include a single layer of silicon oxide (SiOx) or silicon nitride (SiNx), or a double layer of silicon oxide (SiOx) and silicon nitride (SiNx), but embodiments of the present disclosure are not limited thereto. The second insulating layer 307 may include one or more layers, but embodiments of the present disclosure are not limited thereto. For example, the second insulating layer 307 may be an inter-layered insulating layer, but is not limited to a term.

A third buffer layer 310a may be disposed on the second insulating layer 307. For example, since the third buffer layer 310a includes silicon oxide (SiOx) that does not contain hydrogen particles, the third buffer layer 310a may protect at least one or more of the first semiconductor layer 315 of the first transistor 370, the second semiconductor layer 311 of the second transistor 360, and a third semiconductor layer 312 of the third transistor 340 that use an oxide semiconductor layer whose reliability may be damaged by hydrogen particles. For example, the third buffer layer 310a may include a single layer of silicon oxide (SiOx) or silicon nitride (SiNx), or a double layer of silicon oxide (SiOx) and silicon nitride (SiNx), but embodiments of the present disclosure are not limited thereto.

A fourth buffer layer 310b may be disposed on the third buffer layer 310a. For example, the fourth buffer layer 310b may include silicon nitride (SiNx) having an excellent ability to trap (or capture) hydrogen particles, but embodiments of the present disclosure are not limited thereto. For example, the fourth buffer layer 310b may include a single layer of silicon oxide (SiOx) or silicon nitride (SiNx), or a double layer of silicon oxide (SiOx) and silicon nitride (SiNx), but embodiments of the present disclosure are not limited thereto. The silicon nitride (SiNx) layer may have a better ability to trap (or capture) hydrogen particles than the silicon oxide (SiOx) layer. In another embodiment of the present disclosure, at least one of the third buffer layer 310a and the fourth buffer layer 310b may be used, but embodiments of the present disclosure are not limited thereto.

For example, the third buffer layer 310a and/or the fourth buffer layer 310b may separate the first semiconductor layer 315 of the first transistor 370 and the second semiconductor layer 311 of the second transistor 360, and provide a base for the first semiconductor layer 315 and the second semiconductor layer 311.

A third insulating layer 313a may be disposed on the fourth buffer layer 310b. For example, the third insulating layer 313a may include a single layer of silicon oxide (SiOx) or silicon nitride (SiNx), or a double layer of silicon oxide (SiOx) and silicon nitride (SiNx), but embodiments of the present disclosure are not limited thereto. The third insulating layer 313a may be a gate insulating layer, but is not limited to a term. In an embodiment of the present disclosure, the third insulating layer 313a may be referred to as a first insulating layer, but embodiments of the present disclosure are not limited thereto.

According to an embodiment of the present disclosure, transistors may be disposed in the display area AA. For example, the transistors may include the first transistor 370 and the second transistor 360. A gate driving part may be disposed in the non-display area NA.

The first transistor 370 according to an embodiment of the present disclosure may be disposed on the substrate 101. The first transistor 370 according to an embodiment of the present disclosure may include the first semiconductor layer 315 on the substrate 101, the third insulating layer 313a on the first semiconductor layer 315, a first gate electrode 373 on third insulating the layer 313a and a fourth insulating layer 313b on the first gate electrode 373.

For example, the first transistor 370 may be disposed on the buffer layer. The first transistor 370 may include the first semiconductor layer 315 and the first gate electrode 373. For example, the first semiconductor layer 315 may be a first oxide semiconductor layer or an active layer, but is not limited to a term.

The first semiconductor layer 315 according to an embodiment of the present disclosure may be disposed on the buffer layer. For example, the first semiconductor layer 315 may be disposed on the fourth buffer layer 310b. The first semiconductor layer 315 may include an oxide semiconductor material, but embodiments of the present disclosure are not limited thereto. For example, a transistor having an oxide semiconductor material for a semiconductor layer has an excellent leakage current blocking effect and may relatively reduce manufacturing cost compared to a transistor having a polycrystalline semiconductor material for a semiconductor layer. For example, to reduce power consumption and manufacturing cost, in an embodiment of the present disclosure, the first transistor may include an oxide semiconductor material, and at least one or more of the second transistor and third transistor may include an oxide semiconductor material.

For example, the oxide semiconductor material may include at least one or more of an IGZO (InGaZnO)-based oxide semiconductor material, an IZO (InZnO)-based oxide semiconductor material, an IGZTO (InGaZnSnO)-based oxide semiconductor material, an ITZO (InSnZnO)-based oxide semiconductor material, a FIZO (FeInZnO)-based oxide semiconductor material, a ZnO-based oxide semiconductor material, a SIZO (SiInZnO)-based oxide semiconductor material, and a ZnON (Zn-Oxynitride)-based oxide semiconductor material, but embodiments of the present disclosure are not limited thereto.

According to another embodiment of the present disclosure, all or some transistors (e.g., a driving transistor) of one sub-pixel may be formed by using an oxide semiconductor material, and some second transistors (e.g., a switching transistor and/or a sampling transistor) of one sub-pixel may be formed by using an oxide semiconductor material.

The first semiconductor layer 315 may include an oxide semiconductor material. In the past, a polycrystalline semiconductor layer, which is advantageous for high-speed operation, was formed as a semiconductor layer of the first transistor. However, the first transistor including the polycrystalline semiconductor layer has a problem in that power consumption increases due to leakage current generated in an off state. Accordingly, embodiments of the present disclosure propose a transistor including an oxide semiconductor layer, which is advantageous for reducing or blocking the generation of leakage current, as a semiconductor layer thereof.

In the case of a transistor, a source node voltage may fluctuate due to a voltage change at a gate electrode, which may be referred to as a kick-back phenomenon. A voltage of a gate node may fluctuate due to a voltage change of a source node or drain node. Due to this, a defect may occur in a low gray level region where precise current control is required. In an embodiment of the present disclosure, a transistor in which a voltage change at a source node is small due to a voltage change at a gate node is provided.

The first semiconductor layer 315 may include a first channel region 315C, a first source region 315S, and a first drain region 315D. The first channel region 315C may be an intrinsic region where an impurity is not doped. The first source region 315S and the first drain region 315D may include a conductive region where an impurity is doped.

The third insulating layer 313a may be disposed on the first semiconductor layer 315. For example, the third insulating layer 313a may cover the first semiconductor layer 315.

The first gate electrode 373 may be disposed on the third insulating layer 313a. The first gate electrode 373 may overlap the first semiconductor layer 315. For example, the first gate electrode 373 may overlap the first channel region 315C of the first semiconductor layer 315. For example, the third insulating layer 313a may be disposed between the first gate electrode 373 and the first semiconductor layer 315. For example, the first gate electrode 373 may be between the third insulating layer 313a and the fourth insulating layer 313b.

The first gate electrode 373 may include a metal material. For example, the first gate electrode 373 may include a single layer or multiple layers one of molybdenum (Mo), aluminum (Al), chromium (Cr), gold (Au), titanium (Ti), nickel (Ni), neodymium (Nd), tungsten (W), and copper (Cu), or an alloy thereof, but embodiments of the present disclosure are not limited thereto.

The second transistor 360 according to an embodiment of the present disclosure may be disposed on the substrate 101. The second transistor 360 according to an embodiment of the present disclosure may include the second semiconductor layer 311 on the substrate 101, the third insulating layer 313a on the second semiconductor layer 311, the second gate electrode 314 on third insulating layer 313a, and the fourth insulating layer 313b on the second gate electrode 314.

For example, the second transistor 360 may be disposed on the buffer layer. The second transistor 360 may include the second semiconductor layer 311 and the second gate electrode 314. For example, the second semiconductor layer 311 may be a second oxide semiconductor layer or an active layer, but is not limited to a term. For example, the second transistor 360 is a switching transistor, for example, one or more of the fourth transistor T4 described in FIG. 4, the sixth transistor T6 described in FIG. 4, and the seventh transistor T7 described in FIG. 4, but embodiments of the present disclosure are not limited thereto.

The second semiconductor layer 311 according to an embodiment of the present disclosure may be disposed on the buffer layer. For example, the second semiconductor layer 311 may be disposed on the fourth buffer layer 310b. The second semiconductor layer 311 may include an oxide semiconductor material, but embodiments of the present disclosure are not limited thereto. For example, a transistor having an oxide semiconductor material for a semiconductor layer has an excellent leakage current blocking effect and can relatively reduce manufacturing cost compared to a transistor including a polycrystalline semiconductor material for a semiconductor layer. For example, to reduce power consumption and manufacturing cost, in an embodiment of the present disclosure, the first transistor may include an oxide semiconductor material, and at least one of the second transistor and the third transistor may include an oxide semiconductor material.

The second semiconductor layer 311 may include a second channel region 311C, a second source region 311S, and a second drain region 311D. The second channel region 311C may be an intrinsic region where an impurity is not doped. The second source region 311S and the second drain region 311D may include a conductive region where an impurity is doped.

The second semiconductor layer 311 may be disposed at the same layer as the first semiconductor layer 315. For example, the second semiconductor layer 311 of the second transistor 360 may be disposed at the same layer as the first semiconductor layer 315 of the first transistor 370.

The third insulating layer 313a may be disposed on the second semiconductor layer 311. The third insulating layer 313a may cover the second semiconductor layer 311.

The second gate electrode 314 may be disposed on the third insulating layer 313a. The second gate electrode 314 may overlap the second semiconductor layer 311. For example, the second gate electrode 314 may overlap the second channel region 311C of the second semiconductor layer 311. For example, the third insulating layer 313 a may be disposed between the second gate electrode 314 and the second semiconductor layer 311. For example, the second gate electrode 314 may be between the third insulating layer 313a and the fourth insulating layer 313b.

The second gate electrode 314 may be disposed at the same layer as the first gate electrode 373. For example, the second gate electrode 314 of the second transistor 360 may be disposed at the same layer as the first gate electrode 373 of the first transistor 370.

A distance between the first semiconductor layer 315 and the first gate electrode 373 may be the same as a distance between the second semiconductor layer 311 and the second gate electrode 314. For example, the distance between the first semiconductor layer 315 and the first gate electrode 373 of the first transistor 370 may be the same as the distance between the second semiconductor layer 311 and the second gate electrode 314 of the second transistor 376.

The second gate electrode 314 may include a metal material. For example, the second gate electrode 314 may include a single layer or multiple layers of one of molybdenum (Mo), aluminum (Al), chromium (Cr), gold (Au), titanium (Ti), nickel (Ni), neodymium (Nd), tungsten (W), and copper (Cu), or an alloy thereof, but embodiments of the present disclosure are not limited thereto.

The display apparatus according to an embodiment of the present disclosure may further include a third transistor 340.

The third transistor 340 according to an embodiment of the present disclosure may be disposed on the substrate 101. The third transistor 340 according to an embodiment of the present disclosure may include the third semiconductor layer 312 on the substrate 101, the third insulating layer 313a on the third semiconductor layer 312, the fourth insulating layer 313b on the third insulating layer 313a, and the third gate electrode 344 on the fourth insulating layer 313b.

For example, the third transistor 340 may be disposed on the buffer layer. The third transistor 340 may include the third semiconductor layer 312 and the third gate electrode 344. For example, the third semiconductor layer 312 may be a third oxide semiconductor layer or an active layer, but is not limited to a term. The third transistor 340 may be a switching transistor or a sampling transistor, but is not limited to a term. For example, the third transistor 340 may be the third transistor T3 described in FIG. 4, but embodiments of the present disclosure are not limited thereto.

The third semiconductor layer 312 according to an embodiment of the present disclosure may be disposed on the buffer layer. For example, the third semiconductor layer 312 may be disposed on the fourth buffer layer 310b. The third semiconductor layer 312 may be disposed at the same layer as the first semiconductor layer 315. For example, the third semiconductor layer 312 of the third transistor 340 may be disposed at the same layer as the first semiconductor layer 315 of the first transistor 370. The third semiconductor layer 312 may be disposed at the same layer as the second semiconductor layer 311. For example, the third semiconductor layer 312 of the third transistor 340 may be disposed at the same layer as the second semiconductor layer 311 of the second transistor 360. The third semiconductor layer 312 may be disposed at the same layer as at least one of the first semiconductor layer 315 and the second semiconductor layer 311. For example, the third semiconductor layer 312 of the third transistor 340 may be disposed at the same layer as at least one of the first semiconductor layer 315 of the first transistor 370 and the second semiconductor layer 311 of the second transistor 360.

The third semiconductor layer 312 may include an oxide semiconductor material, but embodiments of the present disclosure are not limited thereto. For example, a transistor including an oxide semiconductor material for a semiconductor layer has an excellent leakage current blocking effect and may relatively reduce manufacturing cost compared to a transistor including a polycrystalline semiconductor material for a semiconductor layer. For example, to reduce power consumption and manufacturing cost, in an embodiment of the present disclosure, a first transistor may include an oxide semiconductor material, and at least one or more of the second transistor and the third transistor may include of an oxide semiconductor material.

The third semiconductor layer 312 may include a third channel region 312C, a third source region 312S, and a third drain region 312D. The third channel region 312C may be an intrinsic region where an impurity is not doped. The third source region 312S and the third drain region 312D may include a conductive region where an impurity is doped.

The third insulating layer 313a may be disposed on the third semiconductor layer 312. For example, the third insulating layer 313a may cover the third semiconductor layer 312.

The third gate electrode 344 may include a metal material. For example, the third gate electrode 344 may include the same material as the first gate electrode 373 and/or the second gate electrode 314, but embodiments of the present disclosure are not limited thereto. For example, the third gate electrode 344 may include a single layer or multiple layers of one of molybdenum (Mo), aluminum (Al), chromium (Cr), gold (Au), titanium (Ti), nickel (Ni), neodymium (Nd), tungsten (W), copper (Cu), and an alloy thereof, but embodiments of the present disclosure are not limited thereto.

For example, a capacitance may occur between the third semiconductor layer 312 and the third gate electrode 344. The capacitance may be a parasitic capacitance, an internal capacitance, or an auxiliary capacitance, but is not limited to a term.

The third transistor 340 may respond more sensitively to a change in threshold voltage than the first transistor 370 and/or the second transistor 360, so that in order to adjust sensitivity according to a change in threshold voltage, the capacitance between the third semiconductor layer 312 and the third gate electrode 344 may be adjusted. Accordingly, the inventors of the present disclosure have conducted extensive research and experiments to adjust the capacitance between the third semiconductor layer 312 and the third gate electrode 344. Through the extensive research and experiments, the display apparatus capable of adjusting the capacitance between the third semiconductor layer 312 and the third gate electrode 344 by further including an insulating layer on the third insulating layer 313a has been invented. This is explained below.

According to an embodiment of the present disclosure, the fourth insulating layer 313b may be further included. The fourth insulating layer 313b may be on the third insulating layer 313a. Since the fourth insulating layer 313b is further formed, the capacitance between the third semiconductor layer 312 and the third gate electrode 344 of the third transistor 370 may be reduced. Since the capacitance between the third semiconductor layer 312 and the third gate electrode 344 is reduced, the sensitivity of the third transistor 340 to a change in threshold voltage may be reduced. Further, since the capacitance between the third semiconductor layer 312 and the third gate electrode 344 is reduced, a decrease in a uniformity of an initial luminance of the third transistor 340 can be improved, and problems such as luminance reduction may be solved. In an embodiment of the present disclosure, the fourth insulating layer 313b may be referred to as a second insulating layer, but embodiments of the present disclosure are not limited thereto.

According to an embodiment of the present disclosure, although not shown in the drawing, the fourth insulating layer 313b may be disposed on the third gate electrode 344.

As shown in FIG. 5, the fourth insulating layer 313b may be disposed on the third insulating layer 313a of the first transistor 370. The third gate electrode 344 may be disposed on the fourth insulating layer 313b. For example, the fourth insulating layer 313b may be disposed between the third semiconductor layer 312 and the third gate electrode 344. For example, the third insulating layer 313a and the fourth insulating layer 313b may be disposed between the third semiconductor layer 312 and the third gate electrode 344. For example, the fourth insulating layer 313b may be disposed between the third insulating layer 313a and the third gate electrode 344.

Since the fourth insulating layer 313b is disposed over the first semiconductor layer 315 including an oxide semiconductor material, the fourth insulating layer 313b may include an inorganic material that does not include hydrogen particles. For example, the fourth insulating layer 313b may include a silicon oxide (SiOx) layer or silicon nitride (SiNx) layer, or a double layer of a silicon oxide (SiOx) layer and a silicon nitride (SiNx) layer, but embodiments of the present disclosure are not limited thereto. The fourth insulating layer 313b may be a gate insulating layer, but is not limited to a term. For example, the third insulating layer 313a may have the same material as or a different material from the fourth insulating layer 313b, but embodiments of the present disclosure are not limited thereto.

According to an embodiment of the present disclosure, to widen a range of adjusting gray levels of the first transistor 370, a capacitance between the first semiconductor layer 315 and the first gate electrode 373 may be configured to be small. Accordingly, a thickness of the third insulating layer 313a may be configured to have a relatively small. Further, in a case that a thickness of the third insulating layer 313a is thick to adjust the capacitance between the third semiconductor layer 312 and the third gate electrode 344, it is difficult to adjust an element characteristic of the first transistor 370. Accordingly, since the fourth insulating layer 313b is further formed, sensitivity to the threshold voltage of the third transistor 340 may be reduced, and element characteristics of the first transistor 370 may be maintained.

According to an embodiment of the present disclosure, the thickness of the fourth insulating layer 313b may be adjusted to adjust the capacitance between the third semiconductor layer 312 and the third gate electrode 344. For example, as the thickness of the third insulating layer 313a and/or the fourth insulating layer 313b disposed between the third semiconductor layer 312 and the third gate electrode 344 increases, the capacitance between the third semiconductor layer 312 and the third gate electrode 344 may be reduced, so that voltage fluctuation of the third semiconductor layer 312 may be reduced. For example, the capacitance between the third gate electrode 344 and the third source region 312S and the capacitance between the third gate electrode 344 and the third drain region 312D may be reduced, so that when a voltage of at least one of the gate node, the source node, and the drain node changes, voltage fluctuations of other nodes may be reduced. Due to this, voltage fluctuation of the display apparatus is reduced, so that performance of the display apparatus may be improved. For example, the thickness of the third insulating layer 313a may be different from that of the fourth insulating layer 313b. For example, the thickness of the third insulating layer 313a may be smaller than that of the fourth insulating layer 313b. For example, when the thickness of the third insulating layer 313a is different from or smaller than the thickness of the fourth insulating layer 313b, voltage change of the third semiconductor layer 312 may be improved.

According to an embodiment of the present disclosure, the third gate electrode 344 may be disposed at a layer different from the first gate electrode 373. For example, the third gate electrode 344 of the third transistor 340 may be disposed at a different layer from the first gate electrode 373 of the first transistor 370. For example, the first gate electrode 373 may be disposed on the third insulating layer 313a. For example, the third gate electrode 344 may be disposed on the fourth insulating layer 313b.

According to an embodiment of the present disclosure, the third gate electrode 344 may be disposed at a layer different from the second gate electrode 314. For example, the third gate electrode 344 of the third transistor 340 may be disposed at a different layer from the second gate electrode 314 of the second transistor 360. For example, the second gate electrode 314 may be disposed on the third insulating layer 313a. For example, the third gate electrode 344 may be disposed on the fourth insulating layer 313b.

The first gate electrode 373 and the second gate electrode 314 may be disposed at a different layer from the third gate electrode 344. For example, the first gate electrode 373 of the first transistor 370 and the second gate electrode 314 of the second transistor 360 may be disposed at a different layer from the third gate electrode 344 of the third transistor 340.

The first transistor 370 and/or the third transistor 340 has a ratio of an amount of change in current amount of an emitting element to an amount of change in threshold voltage greater than a ratio of an amount of change in current amount of an emitting element to an amount of change in threshold voltage of the second transistor 360, so that precise control or adjustment may be required to secure an element characteristic of the transistor. For example, the third transistor 340 has a ratio of an amount of change in current amount of an emitting element to an amount of change in threshold voltage greater than a ratio of an amount of change in current amount of an emitting element to an amount of change in threshold voltage of the first transistor 370, so that precise control or adjustment may be required to secure an element characteristic of the transistor. The distance between the first semiconductor layer 315 and the first gate electrode 373 of the first transistor 370 may be different from the distance between the third semiconductor layer 312 and the third gate electrode 344 of the third transistor 340. For example, the distance between the first semiconductor layer 315 and the first gate electrode 373 of the first transistor 370 may be smaller than the distance between the third semiconductor layer 312 and the third gate electrode 344 of the third transistor 340. The distance between the first semiconductor layer 315 and the first gate electrode 373 may be smaller than the distance between the third semiconductor layer 312 and the third gate electrode 344. The distance between the second semiconductor layer 311 and the second gate electrode 314 may be different from the distance between the third semiconductor layer 312 and the third gate electrode 344. For example, the distance between the second semiconductor layer 311 and the second gate electrode 314 may be smaller than the distance between the third semiconductor layer 312 and the third gate electrode 344. For example, the distance between the second semiconductor layer 311 and the second gate electrode 314 of the second transistor 360 may be smaller than the distance between the third semiconductor layer 312 and the third gate electrode 344 of the third transistor 340. Accordingly, since the ratio of an amount of change in current amount of an emitting element to an amount of change in threshold voltage of each transistor is different, the distance between the gate electrode and the semiconductor layer is adjusted to efficiently control a current amount in an emitting element and secure an element characteristic of the transistor.

Since an effective voltage applied to the third channel region 312C of the third semiconductor layer 312 is inversely proportional to the capacitance (Cgi) between the third semiconductor layer 312 and the third gate electrode 344, the effective voltage applied to the third semiconductor layer 312 may be adjusted by adjusting the distance between the third semiconductor layer 312 and the third gate electrode 344. For example, the capacitance between the third gate electrode 344 and the third source region 312S and the capacitance between the third gate electrode 344 and the third drain region 312D may be reduced, so that when each of voltages of the gate node, the source node, and the drain node varies, voltage fluctuations of other nodes may be reduced.

According to an embodiment of the present disclosure, the capacitance between the third semiconductor layer 312 and the third gate electrode 344 may be different from the capacitance between the first semiconductor layer 315 and the first gate electrode 373. For example, the capacitance between the third semiconductor layer 312 and the third gate electrode 344 may be smaller than the capacitance between the first semiconductor layer 315 and the first gate electrode 373. The capacitance between the third semiconductor layer 312 and the third gate electrode 344 of the third transistor 340 may be different from the capacitance between the first semiconductor layer 315 and the first gate electrode 373 of the first transistor 370. For example, the capacitance between the third semiconductor layer 312 and the third gate electrode 344 of the third transistor 340 may be smaller than the capacitance between the first semiconductor layer 315 and the first gate electrode 373 of the first transistor 370. Since a capacitance is inversely proportional to a distance between two electrodes, if an area between a semiconductor layer and a gate electrode of each transistor is the same, a size (or value) of each capacitance is different. When reverse principle is applied, an arrangement (or layer) of the third gate electrode 344 may differ from an arrangement (or layer) of the first gate electrode 373 or an arrangement (or layer) of the second gate electrode 314.

According to an embodiment of the present disclosure, the capacitance between the third semiconductor layer 312 and the third gate electrode 344 may be different from the capacitance between the second semiconductor layer 311 and the second gate electrode 314. For example, the capacitance between the third semiconductor layer 312 and the third gate electrode 344 of the third transistor 340 may be smaller than the capacitance between the second semiconductor layer 311 and the second gate electrode 314 of the second transistor 360.

According to an embodiment of the present disclosure, a fifth insulating layer 316 may be disposed on the third gate electrode 344. The fifth insulating layer 316 may be disposed on the fourth insulating layer 313b of the first transistor 370 and the third transistor 340. For example, the fifth insulating layer 316 may cover the third gate electrode 344 of the third transistor 340. Since the fifth insulating layer 316 is disposed over the first semiconductor layer 315 and the second semiconductor layer 311 of an oxide semiconductor material, the fifth insulating layer 316 may include an inorganic layer that does not include hydrogen particles. Since the fifth insulating layer 316 is disposed over the third semiconductor layer 312 of an oxide semiconductor material, the fifth insulating layer 316 may include an inorganic layer that does not include hydrogen particles. For example, the fifth insulating layer 316 may include a silicon oxide (SiOx) layer, a silicon nitride (SiNx) layer, or a double layer of a silicon oxide (SiOx) layer and a silicon nitride (SiNx) layer, but embodiments of the present disclosure are not limited thereto. The fifth insulating layer 316 may include one or more layers, but embodiments of the present disclosure are not limited thereto. For example, the fifth insulating layer 316 may be an inter-layered insulating layer, but is not limited to a term. In an embodiment of the present disclosure, the fifth insulating layer 316 may be referred to as a third insulating layer, but embodiments of the present disclosure are not limited thereto.

The first gate electrode 373 may be disposed at a different layer from the third gate electrode 344. For example, the first gate electrode 373 may be disposed between the fourth buffer layer 310b and the third insulating layer 313a. For example, the third gate electrode 344 may be disposed between the fourth insulating layer 313b and the fifth insulating layer 316.

According to an embodiment of the present disclosure, a source electrode and a drain electrode may be disposed on the fifth insulating layer 316.

For example, a first source electrode 375S and a first drain electrode 375D may be disposed on the fifth insulating layer 316 of the first transistor 370. The first source electrode 375S and the first drain electrode 375D may be respectively connected to the first source region 315S and the first drain region 315D. For example, the first source electrode 375S and the first drain electrode 375D may be respectively connected to the first source region 315S and the first drain region 315D through contact holes. For example, the contact hole may be formed to pass through the third insulating layer 313a, the fourth insulating layer 313b, and the fifth insulating layer 316. The first source electrode 375S and the first drain electrode 375D may include a single layer or multiple layers of at least one of molybdenum (Mo), aluminum (Al), chromium (Cr), gold (Au), titanium (Ti), nickel (Ni), neodymium (Nd), tungsten (W), copper (Cu), and an alloy thereof, but embodiments of the present disclosure are not limited thereto.

For example, a second source electrode 319S and a second drain electrode 319D may be disposed on the fifth insulating layer 316 of the second transistor 360. The second source electrode 319S and the second drain electrode 319D may be respectively connected to the second source region 311S and the second drain region 311D. For example, the second source electrode 319S and the second drain electrode 319D may be connected to the second source region 311S and the second drain region 311D, respectively, through contact holes. For example, the contact holes may be formed to pass through the third insulating layer 313a, the fourth insulating layer 313b and the fifth insulating layer 316. The second source electrode 319S and the second drain electrode 319D may include a single layer or multiple layers of at least one of molybdenum (Mo), aluminum (Al), chromium (Cr), gold (Au), titanium (Ti), nickel (Ni), neodymium (Nd), tungsten (W), copper (Cu), and an alloy thereof, but embodiments of the present disclosure are not limited thereto.

The second source electrode 319S and the second drain electrode 319D may include a same material as the first source electrode 375S and the first drain electrode 375D, but embodiments of the present disclosure are not limited thereto. For example, the second source electrode 319S and the second drain electrode 319D may be simultaneously formed of the same material as the first source electrode 375S and the first drain electrode 375D on the fifth insulating layer 316, so that a number of mask processes may be reduced.

For example, a third source electrode 328S and a third drain electrode 328D may be disposed on the fifth insulating layer 316 of the third transistor 340. The third source electrode 328S and the third drain electrode 328D may be respectively connected to the third source region 312S and the third drain region 312D. For example, the third source electrode 328S and the third drain electrode 328D may be respectively connected to the third source region 312S and the third drain region 312D through contact holes. For example, the contact hole may be formed to pass through the third insulating layer 313a, the fourth insulating layer 313b, and the fifth insulating layer 316. The third source electrode 328S and the third drain electrode 328D may include a single layer or multiple layers of at least one of molybdenum (Mo), aluminum (Al), chromium (Cr), gold (Au), titanium (Ti), nickel (Ni), neodymium (Nd), tungsten (W), copper (Cu), and an alloy thereof, but embodiments of the present disclosure are not limited thereto.

The first source electrode 375S and the first drain electrode 375D may be formed of the same material as the third source electrode 328S and the third drain electrode 328D, but embodiments of the present disclosure are not limited thereto. The third source electrode 328S and the third drain electrode 328D may be formed of the same material as the first source electrode 375S and the first drain electrode 375D, and/or the second source electrode 319S and the second drain electrode 319D, but embodiments of the present disclosure are not limited thereto. For example, the first source electrode 375S and the first drain electrode 375D, and the second source electrode 328S and the second drain electrode 328D may be simultaneously formed of the same material on the fifth insulating layer 316, so that a number of mask processes can be reduced. For example, the third source electrode 319S and the third drain electrode 319D may be simultaneously formed of the same material as the first source electrode 375S and the first drain electrode 375D, and the second source electrode 328S and the second drain electrode 328D on the fifth insulating layer 316, so that a number of mask processes may be reduced.

In embodiments of the present disclosure, the source electrode and the drain electrode are distinguished for convenience of explanation, and the source electrode and the drain electrode may be interchanged. For example, the source electrode may become the drain electrode, and the drain electrode may become the source electrode. For another example, a source electrode of one embodiment of the present disclosure may be a drain electrode of another embodiment of the present disclosure, and a drain electrode of one embodiment of the present disclosure may be a source electrode of another embodiment of the present disclosure.

According to an embodiment of the present disclosure, the first semiconductor layer 315 of the first transistor 370, the second semiconductor layer 311 of the second transistor 360, and the third semiconductor layer 312 of the third transistor 340 may be formed of an oxide semiconductor layer. Accordingly, it can be advantageous to reduce or block generation of leakage current, and the display apparatus capable of preventing leakage current in a still image may be provided.

Referring to FIG. 5, the first transistor 370 may further include a fourth gate electrode 371.

The fourth gate electrode 371 may be disposed in the third buffer layer 310a. The fourth gate electrode 371 may be disposed between the third buffer layer 310a and the fourth buffer layer 310b. For example, the fourth gate electrode 371 may overlap the first semiconductor layer 315. The fourth gate electrode 371 may be a light blocking layer, but is not limited to a term.

For example, the fourth gate electrode 371 may be inserted into or accommodated in the third buffer layer 310a. For example, the fourth gate electrode 371 may be inserted between or may be accommodated by the third buffer layer 310a and the fourth buffer layer 310b. The fourth gate electrode 371 may be disposed on the third buffer layer 310a which is disposed over the second insulating layer 307. The fourth buffer layer 310b may cover the fourth gate electrode 371. For example, the third buffer layer 310a and the fourth buffer layer 310b may have a sequentially stacked (or laminated) structure, but embodiments of the present disclosure are not limited thereto.

The third buffer layer 310a and the fourth buffer layer 310b may include silicon oxide (SiOx). Since the third buffer layer 310a and the fourth buffer layer 310b include silicon oxide (SiOx) that does not include hydrogen particles, they may provide a base for the first transistor 370 and the second transistor 360 including an oxide semiconductor layer whose reliability may be damaged by hydrogen particles.

The fourth gate electrode 371 according to an embodiment of the present disclosure may include a material having an excellent ability to trap hydrogen particles. For example, the fourth gate electrode 371 may include a metal layer including a titanium (Ti) material. For example, the fourth gate electrode 371 may be a single layer of titanium, a multiple layer of molybdenum (Mo) and titanium (Ti), an alloy of molybdenum (Mo) and titanium (Ti), or TiN, but embodiments of the present disclosure are not limited thereto. For example, the fourth gate electrode 371 may include another metal layer including titanium (Ti).

Titanium (Ti) may prevent hydrogen particles from reaching the first semiconductor layer 315 by trapping (or capturing) hydrogen particles diffusing in the third and fourth buffer layers 310a and 310b. Therefore, the first transistor 370 according to an embodiment of the present disclosure includes the fourth gate electrode 371 formed of a metal layer such as titanium (Ti) capable of trapping hydrogen particles, so that it is possible to improve a problem that a reliability of the oxide semiconductor layer is damaged by hydrogen particles.

The fourth gate electrode 371 according to an embodiment of the present disclosure may be larger than the first semiconductor layer 315 to overlap the first semiconductor layer 315. For example, the fourth gate electrode 371 may be formed to be larger than the first semiconductor layer 315 to completely overlap the first semiconductor layer 315.

The first source electrode 375S of the first transistor 370 may be electrically connected to the fourth gate electrode 371. For example, the first source electrode 375S may be electrically connected to the fourth gate electrode 371 through a contact hole. For example, the contact hole may be formed in or to pass through the fourth buffer layer 310b, the third insulating layer 313a, the fourth insulating layer 313b, and the fifth insulating layer 316.

According to an embodiment of the present disclosure, when the fourth gate electrode 371 is disposed in the third buffer layer 310a and the first source electrode 375S is electrically connected to the fourth gate electrode 371, an effect of a current increase can be obtained. According to an embodiment of the present disclosure, since the first transistor 370 has a dual-gate (or double-gate) structure, a flow of current flowing through the first channel region 315C may be more precisely controlled and can be formed in a smaller size, whereby the display apparatus of a high resolution may be implemented.

According to an embodiment of the present disclosure, when the fourth gate electrode 371 is disposed between the third buffer layer 310a and the fourth buffer layer 310b, and the first source electrode 375S is electrically connected to the fourth gate electrode 371, an effect of a current increase can be obtained. According to an embodiment of the present disclosure, since the first transistor 370 has a dual-gate (or double-gate) structure, a flow of current flowing through the first channel region 315C may be more precisely controlled and can be formed in a smaller size, whereby the display apparatus of a high resolution may be implemented.

Referring to FIG. 5, the second transistor 360 may further include a fifth gate electrode 308. The fifth gate electrode 308 may be disposed below the third buffer layer 310a. The fifth gate electrode 308 may overlap the second semiconductor layer 311. The fifth gate electrode 308 may be disposed on the first insulating layer 302. For example, the fifth gate electrode 308 may be disposed on a top surface (or an upper surface) of the first insulating layer 302. For example, the fifth gate electrode 308 may be a light blocking layer, but is not limited to a term.

For example, the fifth gate electrode 308 may be disposed at a different layer from the fourth gate electrode 371. For example, the fourth gate electrode 371 may be disposed at a layer different from at least one or more of the fifth gate electrode 308 and the sixth gate electrode 304.

A distance between the fifth gate electrode 308 and the second semiconductor layer 311 may be different from a distance between the fourth gate electrode 371 and the first semiconductor layer 315. For example, the distance between the fifth gate electrode 308 and the second semiconductor layer 311 may be greater than the distance between the fourth gate electrode 371 and the first semiconductor layer 315.

A distance between the fifth gate electrode 308 and the second gate electrode 314 may be different from a distance between the fourth gate electrode 371 and the first gate electrode 373. For example, the distance between the fifth gate electrode 308 and the second gate electrode 314 may be greater than the distance between the fourth gate electrode 371 and the first gate electrode 373.

The fifth gate electrode 308 may include the same material as the fourth gate electrode 371, and a description thereof is substantially the same as that of the fourth gate electrode 371 so that a detailed description thereof may be omitted here.

The fifth gate electrode 308 may be electrically connected to the second gate electrode 314. Accordingly, the second transistor 360 may have a dual gate structure or double gate structure, but is not limited to a term. Since the second transistor 360 has a dual gate (or double gate) structure, a flow of current flowing through the second channel region 311C may be more precisely controlled and be formed in a smaller size, whereby the display apparatus of a high resolution may be implemented.

According to an embodiment of the present disclosure, since the fourth gate electrode 371 of the first transistor 370 is disposed closer to the first semiconductor layer 315 than the fifth gate electrode 314 of the second transistor 360, a range for controlling gray levels of the first transistor 370 may be widened. Accordingly, since the emitting element may be precisely controlled even in low gray levels, the display apparatus capable of solving a problem of screen staining occurring in low gray levels may be provided.

Referring to FIG. 5, the third transistor 340 may further include the sixth gate electrode 304. The sixth gate electrode 304 may be disposed below the third buffer layer 310a. The sixth gate electrode 304 may overlap the third semiconductor layer 312. The sixth gate electrode 304 may be disposed on the first insulating layer 302. For example, the sixth gate electrode 304 may be disposed on a top surface (or an upper surface) of the first insulating layer 302. For example, the sixth gate electrode 304 may be a light blocking layer, but is not limited to a term.

For example, the sixth gate electrode 304 may be disposed at a different layer from the fourth gate electrode 371. For example, the sixth gate electrode 304 may be disposed at the same layer as the fifth gate electrode 308. For example, the fourth gate electrode 371 may be disposed at a layer different from at least one or more of the fifth gate electrode 308 and the sixth gate electrode 304.

The sixth gate electrode 304 may include the same material as the fourth gate electrode 371, and a description thereof is substantially the same as that of the fourth gate electrode 371 so that a detailed description thereof may be omitted here.

A distance between the sixth gate electrode 304 and the third semiconductor layer 312 may be different from a distance between the fourth gate electrode 371 and the first semiconductor layer 315. For example, the distance between the sixth gate electrode 304 and the third semiconductor layer 312 may be greater than the distance between the fourth gate electrode 371 and the first semiconductor layer 315.

The distance between the fifth gate electrode 308 and the second semiconductor layer 311 may be the same as the distance between the sixth gate electrode 304 and the third semiconductor layer 312.

A distance between the sixth gate electrode 304 and the third gate electrode 344 may be different from a distance between the fourth gate electrode 371 and the first gate electrode 373. For example, the distance between the sixth gate electrode 304 and the third gate electrode 344 may be greater than the distance between the fourth gate electrode 371 and the first gate electrode 373.

The distance between the fifth gate electrode 308 and the second gate electrode 314 may be different from the distance between the sixth gate electrode 304 and the third gate electrode 344. For example, the distance between the fifth gate electrode 308 and the second gate electrode 314 may be greater than the distance between the sixth gate electrode 304 and the third gate electrode 344.

The sixth gate electrode 304 may be electrically connected to the third gate electrode 344. Accordingly, the third transistor 340 may have a dual gate structure or a dual gate structure, but is not limited to a term. Since the third transistor 340 has a dual gate (or double gate) structure, a flow of current flowing through the third channel region 312C may be more accurately controlled and may be formed in a smaller size, whereby the display apparatus of a high resolution may be implemented.

Referring to FIG. 5, the display apparatus according to an embodiment of the present disclosure may further include a storage capacitor 350. The storage capacitor 350 may be disposed in the display area AA.

The storage capacitor 350 may store the data voltage applied through the data line for a certain period and then provide the data voltage to the emitting element.

The storage capacitor 350 may include two electrodes corresponding to each other and a dielectric layer between the two electrodes. The storage capacitor 350 may include a first storage electrode 305 and a second storage electrode 309. For example, the first storage electrode 305 may be a first capacitor electrode, but is not limited to a term. For example, the second storage electrode 309 may be a second capacitor electrode, but is not limited to a term.

The first storage electrode 305 and the six gate electrode 304 may be formed of the same material and disposed at the same layer.

The second insulating layer 307 may be disposed between the first storage electrode 305 and the second storage electrode 309. The first storage electrode 305 may be electrically connected to the third source electrode 328S.

The third buffer layer 310a and the fourth buffer layer 310b may be disposed on the second storage electrode 309. The third insulating layer 313a and the fourth insulating layer 313b may be disposed on the fourth buffer layer 310b, and the fifth insulating layer 316 may be disposed on the fourth insulating layer 313b. Since explanations of the third buffer layer 310a, the fourth buffer layer 310b, the third insulating layer 313a, the fourth insulating layer, and the fifth insulating layer 316 are substantially the same as those explained above, detailed explanations may be omitted here.

Referring to FIG. 5, the gate driving part may be included in the non-display area NA. The gate driving part may be a driving part including a gate in panel (GIP) circuit. For example, the gate driving part may be a GIP type, but embodiments of the present disclosure are not limited thereto.

A fourth transistor 330 may be disposed on the substrate 101. The fourth transistor 330 may be a switching transistor, but is not limited to a term.

The fourth transistor 330 may be disposed in the non-display area NA. The fourth transistor 330 may apply a gate voltage to the second transistor 360 and the third transistor 340.

The fourth transistor 330 may include a fourth semiconductor layer 303 and a seventh gate electrode 306.

The fourth semiconductor layer 303 may be formed of a polycrystalline semiconductor layer. The fourth semiconductor layer 303 may include a channel through which electrons or holes move. The fourth semiconductor layer 303 may be an active layer, but is not limited to a term.

The fourth semiconductor layer 303 may include a fourth channel region 303C, a fourth source region 303S, and a fourth drain region 303D. A fourth source region 303S and a fourth drain region 303D may be disposed with the fourth channel region 303C interposed therebetween.

The fourth source region 303S and the fourth drain region 303D may include a conductive region having an intrinsic polycrystalline semiconductor material with group 5 or group 3 impurity ions, for example, phosphorus (P) or boron (B) at a predetermined concentration. The fourth channel region 303C may include an intrinsic polycrystalline semiconductor material and provides a path for electrons or holes to move.

According to another embodiment of the present disclosure, the fourth semiconductor layer 303 may include an oxide semiconductor layer. When the fourth semiconductor layer 303 includes an oxide semiconductor layer, transistors disposed in the non-display area NA and the display area AA may be simultaneously formed in the same process by the same semiconductor material, so that the process is may be simplified. For example, since the first semiconductor layer 315, the second semiconductor layer 311, the third semiconductor layer 312, and the fourth semiconductor layer 303 are formed of oxide semiconductor layers, they can be formed simultaneously in the same process and the process may be simplified. As a result, a fabrication process may be simplified. For example, since the first semiconductor layer 315, the second semiconductor layer 311, the third semiconductor layer 312 and the fourth semiconductor layer 303 include an oxide semiconductor material, the first semiconductor layer 315, the second semiconductor layer 311, the third semiconductor layer 312 and the fourth semiconductor layer 303 may be simultaneously formed through the same process. As a result, a fabrication process may be simplified.

The seventh gate electrode 306 of the fourth transistor 330 may overlap the fourth channel region 3030C of the fourth semiconductor layer 303. The first insulating layer 302 may be disposed between the seventh gate electrode 306 and the fourth semiconductor layer 303. For example, the seventh gate electrode 306 may be a fourth gate electrode, but embodiments of the present disclosure are not limited thereto.

The fourth transistor 330 according to an embodiment of the present disclosure may have a top gate structure in which the seventh gate electrode 306 is disposed on the fourth semiconductor layer 303. Accordingly, since the first storage electrode 305, the fifth gate electrode 308, and the sixth gate electrode 304 formed of a material forming the seventh gate electrode are formed through one mask process, a mask process may be reduced. The seventh gate electrode 306 may be formed at the same layer as the fifth gate electrode 308. For example, the seventh gate electrode 306 may be formed at the same layer as the sixth gate electrode 304. For example, the seventh gate electrode 306 may be formed at the same layer as the first storage electrode 305. For example, the seventh gate electrode 306 may be formed at the same layer as at least one or more of the first storage electrode 305, the fifth gate electrode 308, and the sixth gate electrode 304.

The seventh gate electrode 306 may include a metal material. For example, the seventh gate electrode 306 may be formed of a single layer or multiple layers of at least one of molybdenum (Mo), aluminum (Al), chromium (Cr), gold (Au), titanium (Ti), nickel (Ni), neodymium (Nd), tungsten (W), copper (Cu), and an alloy thereof, but embodiments of the present disclosure are not limited thereto.

The second insulating layer 307 may be disposed on the seventh gate electrode 306. The second insulating layer 307 may include silicon nitride (SiNx). For example, the second insulating layer 307 of silicon nitride (SiNx) may include hydrogen particles. After forming the fourth semiconductor layer 303 and depositing the second insulating layer 307 on the fourth semiconductor layer 303, when a heat treatment process is performed, hydrogen particles included in the second insulating layer 307 may penetrate into the fourth source region 303S and the fourth drain region 303D to contribute to improving and stabilizing conductivity of the polycrystalline semiconductor material. The heat treatment may be referred to as a hydrogenation process.

The fourth transistor 330 may include the third buffer layer 310a on the second insulating layer 307, the fourth buffer layer 310b, the third insulating layer 313a, the fourth insulating layer 313b, and the fifth insulating layer 316 on the second insulating layer 307. Since explanations of the third buffer layer 310a, the fourth buffer layer 310b, the third insulating layer 313a, the fourth insulating layer 313b, and the fifth insulating layer 316 are substantially the same as those explained above, detailed explanations may be omitted here.

A fourth source electrode 317S and a fourth drain electrode 317D may be disposed on the fifth insulating layer 316. The fourth source electrode 317S and the fourth drain electrode 317D may be connected to the fourth source region 303S and the fourth drain region 303D, respectively. For example, the fourth source electrode 317S and the fourth drain electrode 317D may be respectively connected to the fourth source region 303S and the fourth drain region 303D through contact holes. For example, the contact hole may be formed to pass through or in the second insulating layer 307, the third buffer layer 310a, the fourth buffer layer 310b, the third insulating layer 313a, the fourth insulating layer 313b, and the fifth insulating layer 316.

Referring to FIG. 5, the display apparatus according to an embodiment of the present disclosure may further include a first passivation layer 320 and a second passivation layer 322.

The first passivation layer 320 may be disposed on the first transistor 370, the second transistor 360, the third transistor 340, and the fourth transistor 330. For example, the first passivation layer 320 may be disposed on the first source electrode 375S, the first drain electrode 375D, the second source electrode 319S, the second drain electrode 319D, the third source electrode 328S, the third drain electrode 328D, the fourth source electrode 317S, and the fourth drain electrode 317D.

For example, the first protective layer 320 may planarize top surfaces (or upper surfaces) of the first transistor 370, the second transistor 360, the third transistor 340, and the fourth transistor 330.

The second passivation layer 322 may be disposed on the first passivation layer 320. The first passivation layer 320 and the second passivation layer 322 may include an organic material such as polyimide or acrylic resin, but embodiments of the present disclosure are not limited thereto. The first passivation layer 320 may be a first planarization layer, but is not limited to a term. The second passivation layer 322 may be a second planarization layer, but is not limited to a term.

According to an embodiment of the present disclosure, a first buffer layer on the substrate 101, a first insulating layer on the first buffer layer, a second buffer layer on the first insulating layer, and a first semiconductor layer, a second semiconductor layer and a third semiconductor layer on the second buffer layer may be included. A third insulating layer on the first semiconductor layer, the second semiconductor layer and the third semiconductor layer, and a first gate electrode and a second gate electrode on the third insulating layer may be further included. A fourth insulating layer on the first gate electrode and the second gate electrode, and a third gate electrode on the fourth insulating layer may be further included. A fifth insulating layer on the third gate electrode, and first source and drain electrodes, second source and drain electrodes, and third source and drain electrodes on the fifth insulating layer may be included.

According to an embodiment of the present disclosure, the first semiconductor layer, the second semiconductor layer, and the third semiconductor layer may be disposed at the same layer. The first gate electrode and the second gate electrode may be disposed at the same layer. The first gate electrode may be disposed at a different layer from the third gate electrode. The second gate electrode may be disposed at a different layer from the third gate electrode. A thickness of the first insulating layer may be different from a thickness of the second insulating layer.

According to an embodiment of the present disclosure, the first semiconductor layer, the first gate electrode, and the first source and drain electrodes may constitute the first transistor. The second semiconductor layer, the second gate electrode, and the second source and drain electrodes may constitute the second transistor. The third semiconductor layer, the third gate electrode, and the third source and drain electrodes may constitute the third transistor.

According to an embodiment of the present disclosure, a distance between the first semiconductor layer and the first gate electrode may be different from a distance between the third semiconductor layer and the third gate electrode. A distance between the second semiconductor layer and the second gate electrode may be different from the distance between the third semiconductor layer and the third gate electrode. A capacitance between the third semiconductor layer and the third gate electrode may be different from a capacitance between the first semiconductor layer and the first gate electrode. The capacitance between the third semiconductor layer and the third gate electrode may be different from a capacitance between the second semiconductor layer and the second gate electrode.

Referring to FIG. 5, an emitting element part or an emitting element layer may be disposed on the second passivation layer 322. The emitting element part or the emitting element layer may include a first electrode 323, a second electrode 327, and an emitting element 325.

The first electrode 323 may be an anode electrode. The first electrode 323 may be configured in each sub-pixel. The first electrode 323 may have a multi-layered structure including a transparent conductive layer and an opaque conductive layer having high reflective efficiency. The transparent conductive layer may include a material having a relatively high work function, such as indium-tin-oxide (ITO) or indium-zinc-oxide (IZO), but embodiments of the present specification are not limited thereto. The opaque conductive layer may have a single-layered or multi-layered structure including Al, Ag, Cu, Pb, Mo, Ti, and an alloy thereof, but embodiments of the present disclosure are not limited thereto. For example, the first electrode 323 may be formed of a structure in which a transparent conductive layer, an opaque conductive layer, and a transparent conductive layer are sequentially stacked, or a structure in which a transparent conductive layer and an opaque conductive layer are sequentially stacked, but embodiments of the present disclosure are not limited thereto.

When the display apparatus 1000 has a top emission display apparatus, the first electrode 323 may be a reflective electrode that reflects light and may include an opaque conductive material. For example, the first electrode 510 may include at least one or more of silver (Ag), aluminum (Al), gold (Au), molybdenum (Mo), tungsten (W), chromium (Cr), and alloys thereof, but embodiments of the present disclosure are not limited thereto. For example, the first electrode 323 may have a three-layered structure of silver (Ag)/palladium (Pd)/copper (Cu), but embodiments of the present disclosure are not limited thereto.

When the display apparatus 1000 has a bottom emission display apparatus, the first electrode 323 may include a transparent conductive material that transmits light. For example, the first electrode 323 may include at least one or more of indium tin oxide (ITO) and indium zinc oxide (IZO), but embodiments of the present disclosure are not limited thereto.

The second electrode 327 may be a cathode electrode. For example, the second electrode 327 may face the first electrode 323 with the emitting element 325 therebetween. The second electrode 327 may be formed on top (or upper) and side surfaces of the emitting element 325. The second electrode 327 may be integrally formed on an entire surface of the display area AA. When the display apparatus 1000 has a top emission type light emitting display apparatus, the second electrode 327 may include a transparent conductive material that transmits light. For example, the second electrode 327 may be formed of at least one of indium tin oxide (ITO) and indium zinc oxide (IZO), but embodiments of the present disclosure are not limited thereto.

In another embodiment of the present disclosure, the second electrode 327 may be formed of a translucent conductive material that transmits light. For example, the second electrode 327 may include at least one or more of alloys such as LiF/Al, CsF/Al, Mg:Ag, Ca/Ag, Ca:Ag, LiF/Mg:Ag, LiF/Ca/Ag, and LiF/Ca:Ag, but embodiments of the present disclosure are not limited thereto.

When the display apparatus 1000 has a bottom emission display apparatus, the second electrode 327 may be a reflective electrode that reflects light and may include an opaque conductive material. For example, the second electrode 327 may include at least one or more of silver (Ag), aluminum (Al), gold (Au), molybdenum (Mo), tungsten (W), chromium (Cr), and an alloy thereof, but embodiments of the present disclosure are not limited thereto.

The emitting element 325 may be disposed between the first electrode 323 and the second electrode 327. The emitting element 325 may include a hole transfer layer, an emitting layer, and an electron transfer layer in the order or reverse order on the first electrode 323. For example, the hole transfer layer may be a layer that injects or transports holes into the emitting layer. For example, the hole transfer layer may be a hole injection layer, a hole transport layer, and an electron blocking layer, but embodiments of the present disclosure are not limited thereto. The electron transfer layer may be a layer that injects or transports electrons into the emitting layer. For example, the electron transfer layer may be an electron transport layer, an electron injection layer, and a hole blocking layer, but embodiments of the present disclosure are not limited thereto.

The emitting element may include one emitting part. One light emitting part may include a red emitting layer, a green emitting layer, and a blue emitting layer emitting red, green, and blue lights for respective sub-pixels PX.

The emitting element may include two or more light emitting parts. The emitting part may be expressed as a stack, but is not limited to a term. Two or more emitting parts may include a first emitting part and a second emitting part. The first emitting part and the second emitting part may include a red emitting layer, a green emitting layer, and a blue emitting layer emitting red, green, and blue lights for respective sub-pixels. Two or more emitting layers included in the first emitting part and the second emitting part may be emitting layers emitting the same color. For another embodiment of the present disclosure, the first emitting layer included in the first emitting part may be a blue emitting layer, a sky blue emitting layer, a deep blue emitting layer, a blue emitting layer and a red emitting layer, a sky blue emitting layer and a deep blue emitting layer, and a deep blue emitting layer and a red emitting layer, but embodiments of the present disclosure are not limited thereto. For example, the second emitting layer included in the second emitting part may include a yellow emitting layer, a yellow-green emitting layer, a green emitting layer, a yellow emitting layer and a red emitting layer, a yellow-green emitting layer and a red emitting layer, a green emitting layer and a red emitting layer, a combination of a yellow emitting layer, a yellow-green emitting layer and a green emitting layer, a combination of a yellow emitting layer, a yellow-green emitting layer, a green emitting layer and a red emitting layer, a combination of two yellow-green emitting layers and one green emitting layer, a combination of one yellow-green emitting layer and two green emitting layers, a combination of two yellow-green emitting layers, one green emitting layer and a red emitting layer, or a combination of one yellow-green emitting layer, two green emitting layers and a red emitting layer, but embodiments of the present disclosure are not limited thereto. A charge generation layer may be disposed between the first emitting part and the second emitting part. The charge generation layer may include an n-type charge generation layer and a p-type charge generation layer. Each of the first emitting part and the second emitting part may include one or more of a hole injection layer, a hole transport layer, a hole blocking layer, an electron blocking layer, an electron transport layer, and an electron injection layer, but embodiments of the present disclosure are not limited thereto.

Two or more emitting parts may include a first emitting part, a second light emitting part, and a third emitting part. A first emitting layer included in the first emitting part may be the same as described above. A second emitting layer included in the second emitting part may be the same as described above. A third emitting layer included in the third emitting part may have the same configuration as the first emitting layer, but embodiments of the present disclosure are not limited thereto. A first charge generation layer may be disposed between the first emitting part and the second emitting portion. The first charge generation layer may include an n-type charge generation layer and a p-type charge generation layer. A second charge generation layer may be disposed between the second emitting part and the third emitting part. The second charge generation layer may include an n-type charge generation layer and a p-type charge generation layer. Each of the first emitting part, the second emitting part, and the third emitting part may include one or more of a hole injection layer, a hole transport layer, a hole blocking layer, an electron blocking layer, an electron transport layer, and an electron injection layer, but embodiments of the present disclosure are not limited thereto.

Two or more emitting parts may include a first emitting part, a second emitting part, a third emitting part, and a fourth emitting part. At least two or more emitting layers among the first emitting part, the second emitting part, the third emitting part, and the fourth emitting part may include emitting layers emitting the same color. For example, at least two or more emitting layers among the first emitting part, the second emitting part, the third emitting part, and the fourth emitting part may include a blue light emitting layer, but embodiments of the present disclosure are not limited thereto. At least one or more emitting layers of the first emitting part, the second emitting part, the third emitting part, and the fourth emitting part may include emitting layers different from a blue emitting layer. For example, at least one or more emitting layers of the first emitting part, the second emitting part, the third emitting part, and the fourth emitting part may include a yellow emitting layer, a yellow-green emitting layer, a green emitting layer, a yellow emitting layer and a red emitting layer, a yellow-green emitting layer and a red emitting layer, a green emitting layer and a red emitting layer, a combination of a yellow emitting layer, a yellow-green emitting layer and a green emitting layer, a combination of a yellow emitting layer, a yellow-green emitting layer, a green emitting layer and a red emitting layer, a combination of two yellow-green emitting layers and one green emitting layer, a combination of one yellow-green emitting layer and two green emitting layers, a combination of two yellow-green emitting layers, one green emitting layer and a red emitting layer, or a combination of one yellow-green emitting layer, two green emitting layers and a red emitting layer, but embodiments of the present disclosure are not limited thereto. A first charge generation layer may be disposed between the first emitting part and the second emitting part. The first charge generation layer may include an n-type charge generation layer and a p-type charge generation layer. A second charge generation layer may be disposed between the second emitting part and the third emitting part. The second charge generation layer may include an n-type charge generation layer and a p-type charge generation layer. A third charge generation layer may be disposed between the third emitting part and the fourth emitting part. The third charge generation layer may include an n-type charge generation layer and a p-type charge generation layer. Each of the first emitting part the second emitting part the third emitting part, and the fourth emitting part may include one or more of a hole injection layer, a hole transport layer, a hole blocking layer, an electron blocking layer, an electron transport layer, and an electron injection layer, but embodiments of the present disclosure are not limited thereto.

A connection electrode 321 may be disposed on the first passivation layer 320. The emitting element part may be connected to the transistor through the connection electrode 321. For example, the first electrode 323 and the second source electrode 319S of the second transistor 360 may be connected to each other through the connection electrode 321.

The first electrode 323 may be connected to the connection electrode 321 exposed through a contact hole passing through the second passivation layer 322. The connection electrode 321 may be connected to the second source electrode 319S exposed through a contact hole passing through the first passivation layer 320.

A bank layer 324 may expose the first electrode 323 of each sub-pixel. The bank layer 324 may divide the plurality of sub-pixels PX. The bank layer 324 may be a pixel defining layer, but is not limited to a term. The bank layer 324 can minimize light glare between adjacent sub-pixels and prevent light interference between adjacent sub-pixels. The bank layer 324 may prevent color mixing occurring at various viewing angles. The bank layer 324 may be formed of an opaque material, for example, black material. In this case, the bank layer 324 may include a light blocking material made of at least one of color pigments, organic black material, and carbon, but embodiments of the present disclosure are not limited thereto. For example, the bank layer 324 may include at least one of a material such as silicon nitride (SiNx) or silicon oxide (SiOx), and a material such as benzocyclobutene (BCB), acrylic resin, epoxy resin, phenolic resin, polyamide resin, or polyimide resin, but embodiments of the present disclosure are not limited thereto.

A spacer 326 may be further disposed on the bank layer 324. The spacer 326 may buffer an empty space between the substrate 101 on which the emitting element is formed and the upper substrate, thereby minimizing damage to the display apparatus from an external impact. The spacer 326 may include the same material as the bank layer 324 and may be formed simultaneously with the bank layer 151, but embodiments of the present disclosure are not limited thereto.

The emitting element 325 may be disposed on the anode electrode 323, the bank layer 324, and the spacer 326. The emitting element 325 may include at least one or more of a red emitting layer, a green emitting layer, a blue emitting layer, and a white emitting layer in order to emit light of a specific color. When the emitting element 325 includes a white emitting layer, a color filter for converting white light from the white emitting layer into light of a different color may be disposed on the emitting element 325. For example, a color filter may be disposed on a touch part, but embodiments of the present disclosure are not limited thereto. For another example, the color filter may be disposed between the touch part and the encapsulation part, but embodiments of the present disclosure are not limited thereto. For example, light emitted from the emitting element 325 may proceed in the direction to the encapsulation part and display an image through the color filter. For example, the color filter may include red, green, and blue color filters, but embodiments of the present disclosure are not limited thereto. For example, light emitted from the emitting element 325 may display an image through red, green, and blue color filters.

The encapsulation part may be further disposed on the second electrode 327. The encapsulation part can prevent penetration of oxygen or moisture.

The encapsulation part may include a first encapsulation layer 328a, a second encapsulation layer 328b, and a third encapsulation layer 328c, but embodiments of the present disclosure are not limited thereto. For example, the encapsulation part may include at least two or more layers, but embodiments of the present disclosure are not limited thereto. For example, the encapsulation part may have an inclined surface at a periphery the display area AA or in the non-display area NA.

The first encapsulation layer 328a and the third encapsulation layer 328c may include at least one or more of silicon oxide (SiOx), silicon nitride (SiNx), and aluminum oxide (AlyOz), but embodiments of the present disclosure are not limited thereto.

The second encapsulation layer 328b may cover foreign substances or particles that may occur in manufacturing processes. The second encapsulation layer 328b may planarize a surface of the first encapsulation layer 328a. For example, the second encapsulation layer 328b may include at least one or more of acrylic resin, epoxy resin, phenolic resin, polyamide resin, polyimide resin, silicone oxycarbon (SiOCz) and polyethylene, but embodiments of the present disclosure are not limited thereto. The first encapsulation layer 328a, the second encapsulation layer 328b, and the third encapsulation layer 328c may be sequentially stacked, but embodiments of the present disclosure are not limited thereto. For example, the first encapsulation layer 328a of an inorganic material, the second encapsulation layer 328b of an organic material, and the third encapsulation layer 328c of an inorganic material may be sequentially disposed, but embodiments of the present disclosure are not limited thereto.

Referring to FIG. 5, the touch part may be further disposed on the encapsulation part. For example, the touch part for recognizing a user's touch may be disposed on the encapsulation part. Since description of the touch part is substantially the same as described with reference to FIGS. 2 and 3, the same reference numerals are assigned to the same elements, and a repeated description thereof may be omitted or simplified. The description of the touch part is provided together with FIGS. 2 and 3.

A fifth buffer layer 710 may be disposed on the third encapsulation layer 328c of the encapsulation part. The fifth buffer layer 710 may block penetration of a chemical solution (such as a developing solution or an etching solution) used in the manufacturing process of the touch part or moisture from the outside into the emitting element 325 including an organic material. It is possible to prevent a problem that a plurality of touch sensor metals disposed on the fifth buffer layer 710 are disconnected due to an external impact, and to block interference signals that may occur during driving of the touch part. The fifth buffer layer 710 may be a touch buffer layer, but is not limited to a term.

The fifth buffer layer 710 may include a single layer or multiple layers of at least one of silicon oxide (SiOx), silicon nitride (SiNx), and a combination thereof, but embodiments of the present disclosure are not limited thereto. For another example, the fifth buffer layer 710 may include acrylic resin, epoxy resin, phenolic resin, polyamide resin, polyimide resin, or the like, but embodiments of the present disclosure are not limited thereto.

The touch part may include a sixth insulating layer 730, a touch electrode part, and a third passivation layer 750. For example, the sixth insulating layer 730 may be a touch insulating layer, a lower insulating layer, or a lower touch insulating layer, but is not limited to a term. For example, the third passivation layer 750 may be a touch insulating layer, an upper insulating layer, or an upper touch insulating layer, but is not limited to a term.

The touch electrode part may include a plurality of touch electrodes for sensing a user's touch. The plurality of touch electrodes may serve as a touch sensor for sensing a user's touch according to a mutual capacitance method or a self capacitance method. The touch electrode part may include a plurality of first touch electrode channels TX1 arranged in a first direction and a plurality of second touch electrode channels RX1 arranged in a second direction perpendicular to the first direction on the same plane. The plurality of first touch electrode channels TX1 may be touch signal transmitting electrodes or touch TX electrodes, and the plurality of second touch electrode channels RX1 may be touch signal receiving electrodes or touch RX electrodes, but are not limited to a term.

The touch electrode part according to an embodiment of the present disclosure may be implemented as a touch panel including a plurality of touch electrodes. For example, an add-on type touch panel may be disposed or combined on an encapsulation part or an optical film when an emitting element has a top emission structure, and may be disposed on or combined to a rear surface of the substrate when an emitting element has a bottom emission structure.

The touch electrode part according to another embodiment of the present disclosure may be directly formed on the encapsulation part according to an in-cell method. For example, when the emitting element has a top emission structure, the in-cell type touch electrode may be formed directly on a front surface of the encapsulation part, but embodiments of the present disclosure are not limited thereto.

A first connection electrode BE1 may be disposed on the fifth buffer layer 710. For example, the first connection electrode BE1 may connect the plurality of first touch electrode channels TX1 to each other. For example, the first connection electrode BE1 may electrically connect each of the plurality of touch electrode channels TX1 and RX1 to each other while not being electrically connected by being disposed on different planes. The first connection electrode BE1 may be a touch electrode connection line, a touch bridge electrode, or a touch bridge line, but is not limited to a term.

For example, the first connection electrode BE1 may be disposed between the plurality of first touch electrode channels TX1 adjacent to each other in a first direction (or X-axis direction). The first connection electrode BE1 may electrically connect the first touch electrodes connected to the plurality of first touch electrode channels TX1 spaced apart from each other in the first direction (or the X-axis direction) and disposed adjacently, but embodiments of the present disclosure are not limited thereto.

The sixth insulating layer 730 may be disposed on the fifth buffer layer 710 and the first connection electrode BE1. The sixth insulating layer 730 may include a hole to electrically connect the first touch electrode channel TX1 and the first connection electrode BE1. Accordingly, the sixth insulating layer 730 may electrically insulate the first touch electrode channel TX1 and the first connection electrode BE1.

The sixth insulating layer 730 may include a single layer of a silicon nitride (SiNx) layer or silicon oxide (SiOx) layer, or multiple layers thereof, but embodiments of the present disclosure are not limited thereto.

The first touch electrode channel TX1 and the second touch electrode channel RX1 may be disposed on the sixth insulating layer 730.

The first touch electrode channel TX1 and the second touch electrode channel RX1 may be spaced apart from each other by a predetermined interval. At least one or more of first touch electrode channel TX1 adjacent in the first direction (or X-axis direction) may be spaced apart from each other. Each of the at least one or more of first touch electrode channel TX1 adjacent in the first direction (or X-axis direction) may be connected to the first connection electrode BEL For example, each of the first touch electrode channel TX1 adjacent to each other along the first direction (or X axis direction) may be connected to the first connection electrode BE1 through a hole in the sixth insulating layer 730.

The second touch electrode channels RX1 adjacent in the second direction (or Y-axis direction) may be connected by the second connection electrode BE2.

The third passivation layer 750 may be disposed on the first touch electrode channel TX1 and the second touch electrode channel RX1.

The third passivation layer 750 may be disposed to cover the sixth insulating layer 730, the first touch electrode channel TX1, and the second touch electrode channel RX1.

The third passivation layer 750 may include at least one or more of BCB (benzocyclobutene), acrylic resin, epoxy resin, phenolic resin, polyamide resin, and polyimide resin, but embodiments of the present disclosure are not limited thereto. The third passivation layer 750 may be a planarization layer or an insulating layer, but is not limited to a term.

To apply an electric signal to the touch electrode part of the touch part in the display area AA, touch lines may be disposed in the non-display area NA. The touch line may be a touch connection line or a touch routing line, but is not limited to a term.

The touch driving circuit may receive a touch driving signal from the first touch electrode channel TX1. Also, the touch driving circuit may transmit a touch driving signal to the second touch electrode channel RX1. The touch driving circuit may detect a user's touch by a mutual capacitance between a first touch electrode connected to the plurality of first touch electrode channels TX1 and a second touch electrode connected to the second touch electrode channel RX1. For example, when a touch operation is performed on the display apparatus 1000, a capacitance change may occur between the first touch electrode and the second touch electrode. The touch driving circuit may detect a touch coordinate by sensing the change capacitance.

Figure 6:
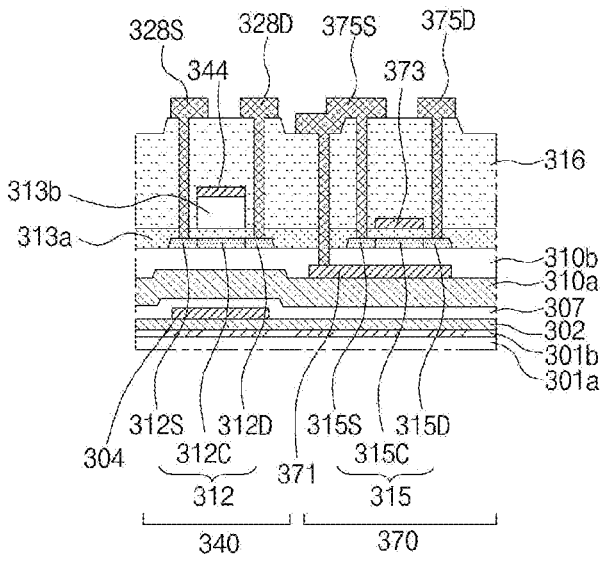
FIG. 6 illustrates a display apparatus according to another embodiment of the present disclosure.
Figure 7A:
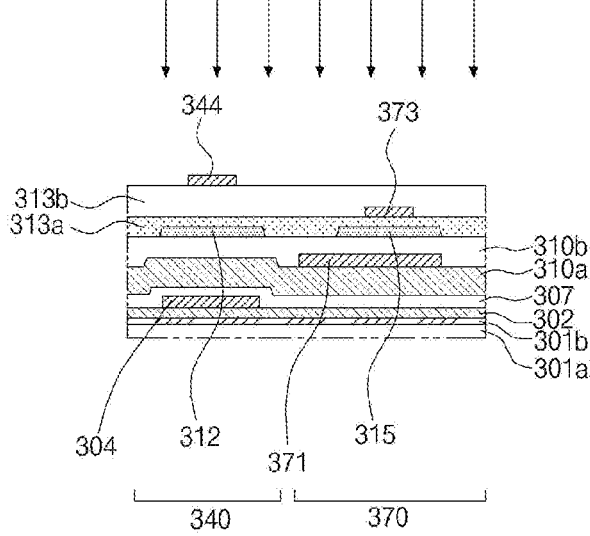
FIGS. 7A to 7C illustrate a sequence of processes according to another embodiment of the present disclosure.
Figure 7B:
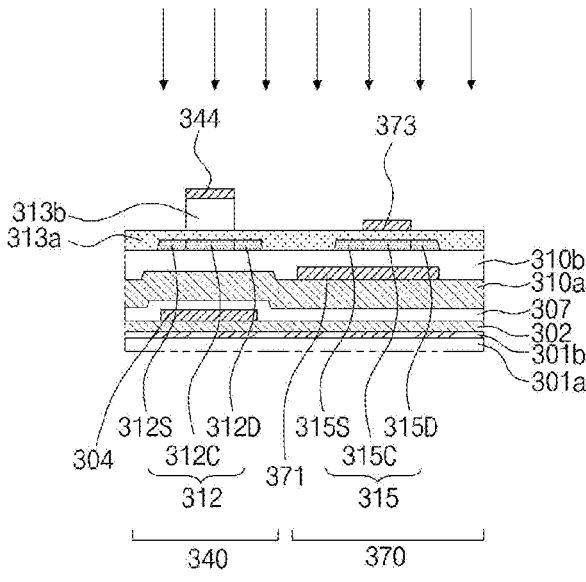
Figure 7C:
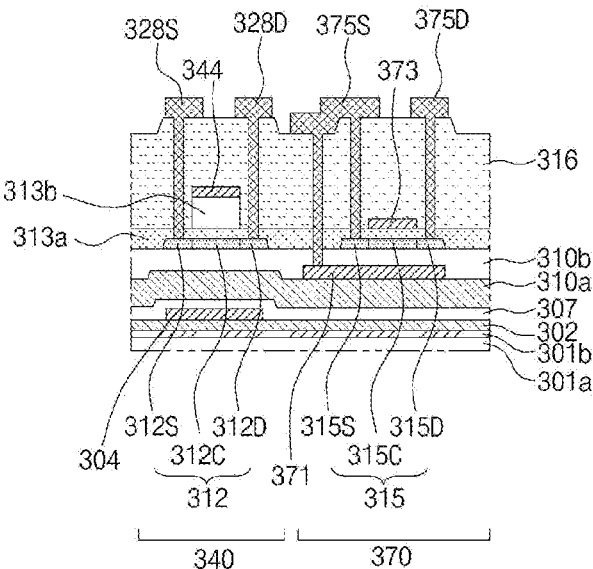

FIG. 6 illustrates a display apparatus according to another embodiment of the present disclosure. FIGS. 7A to 7C illustrate a sequence of processes according to another embodiment of the present disclosure.

In the display apparatus according to an embodiment of the present disclosure, at least two or more insulating layers may be formed on a semiconductor layer. Accordingly, sensitivity according to a change of a threshold voltage of the third transistor 340 may be reduced.

After forming the first to third gate electrodes 373, 314, and 344 of the first to third transistors 370, 360, and 340, a conductorization process of the first to third semiconductor layers 315, 311, and 312 may be performed simultaneously. In this case, even if the conductorization process of the first to third semiconductor layers 315, 311, and 312 is performed under the same doping condition, doping concentrations of the first to third semiconductor layers 315, 311, and 312 are different, so that element characteristic of the first to third transistors 370, 360, and 340 are deteriorated. Also, since doping concentrations of the first to third semiconductor layers 315, 311, and 312 are different, resistance increases or current characteristics in an ON state decrease. Accordingly, a problem in that element characteristics of the first to third transistors 370, 360, and 340 are deteriorated occurs.

After forming the first to third gate electrodes 373, 314, and 344 of the first to third transistors 370, 360, and 340, conductorization processes of the first to third semiconductor layers 315, 311, and 312 may be performed differently. For example, the third insulating layer 313a is formed on the first to third semiconductor layers 315, 311, and 312, and the first gate electrode 373 and the second gate electrode 314 are formed on the third insulating layer 313a. Then, after covering the third transistor 340 with a photoresist, a process of conductorizing the first semiconductor layer 315 and the second semiconductor layer 311 of the first transistor 370 and the second transistor 360 may be performed. Then, the first gate electrode 373 and the second gate electrode 314 of the first transistor 370 and the second transistor 360, and the fourth insulating layer 313b on the third insulating layer 313a of the third transistor 340 may be formed. Then, after covering the first transistor 370 and the second transistor 360 with a photoresist, a process of conductorizing the third semiconductor layer 312 of the third transistor 340 may be performed. During the conductorization process of the third semiconductor layer 312, a doping concentration is difficult to reach the third semiconductor layer 312 due to the thickness of the third insulating layer 313a and the fourth insulating layer 313b. Accordingly, during the conductorization process of the first to third semiconductor layers 315, 311, and 312, thicknesses of conductive regions are different, so that doping concentrations of the first to third semiconductor layers 315, 311, and 312 may be different. Compared to the first transistor 370 and the second transistor 360, the thickness of the conductive region of the third transistor 370 is different by the third insulating layer 313a and/or the fourth insulating layer 313b. Accordingly, it has been recognized that element characteristics of the first transistor 370, the second transistor 360, and the third transistor 340 are deteriorated. Accordingly, the inventors of the present disclosure have conducted extensive research and experiments to improve element characteristics of the first to third transistors 370, 360, and 340. Through extensive research and experiments, a new display apparatus capable of improving element characteristics of the first to third transistors 370, 360, and 340 has been invented. This is explained below.

FIGS. 6 to 7C illustrate a first transistor 370 and a third transistor 340 among the transistors of FIG. 5. The second transistor 360, the fourth transistor 330, and the storage capacitor 350 may be configured substantially the same as those described in FIG. 5.

Referring to FIG. 6, the third insulating layer 313a may be disposed on the first semiconductor layer 315 of the first transistor 370. For example, the third insulating layer 313a may be disposed to be adjacent to (or contact) the third semiconductor layer 312 of the third transistor 340. For example, the third insulating layer 313a may be disposed on the first semiconductor layer 312 of the first transistor 370, the second semiconductor layer 311 of the second transistor 360, and the third semiconductor layer 312 of the third transistor 340. For example, the third insulating layer 313a may be disposed all over the first semiconductor layer 315 of the first transistor 370, the second semiconductor layer 311 of the second transistor 360, and the third semiconductor layer 312 of the third transistor 340.

According to an embodiment of the present disclosure, the fourth insulating layer 313b may be disposed on the third insulating layer 313a of the third transistor 340. For example, the fourth insulating layer 313b may overlap the third semiconductor layer 312 of the third transistor 340. For example, the fourth insulating layer 313b may overlap the third channel region 312C of the third semiconductor layer 312.

The fourth insulating layer 313b of the third transistor 340 may be in (or inside) the third source electrode 328S and the third drain electrode 328D. For example, the fourth insulating layer 313b of the third transistor 340 may be disposed on the third source electrode 328S and the third drain electrode 328D. For example, the fourth insulating layer 313b and the third gate electrode 344 may be in (or inside) the third source electrode 328S and the third drain electrode 328D. For example, the fourth insulating layer 313b and the third gate electrode 344 may be disposed on the third source electrode 328S and the third drain electrode 328D. Accordingly, since the third transistor 340 includes the third insulating layer 313a and the fourth insulating layer 313b, a sensitivity according to a change in threshold voltage due to a threshold voltage of the third transistor 340 can be reduced.

According to an embodiment of the present disclosure, the fifth insulating layer 316 may be on the first gate electrode 373 of the first transistor 370 and the second gate electrode 314 of the second transistor 360. For example, the first transistor 370 may include the first semiconductor layer 315, the third insulating layer 313a on the first semiconductor layer 315, the first gate electrode 373 on the third insulating layer 313a, and the fifth insulating layer 316 on the first gate electrode 373. For example, the second transistor 360 may include the second semiconductor layer 311, the third insulating layer 313a on the second semiconductor layer 311, the second gate electrode 314 on the third insulating layer 313a, and the fifth insulating layer 316 on the second gate electrode 314.

According to an embodiment of the present disclosure, the fifth insulating layer 316 of the third transistor 340 may be on the third gate electrode 344. For example, the fifth insulating layer 316 of the third transistor 340 may be disposed on the fourth insulating layer 313b and the third gate electrode 344. For example, the fifth insulating layer 316 may cover the fourth insulating layer 313b and the third gate electrode 344. For example, the third transistor 340 may include the third semiconductor layer 312, the third insulating layer 313a on the third semiconductor layer 312, the fourth insulating layer 313b on the third insulating layer 313a, the third gate electrode 344 on the fourth insulating layer 313b, and the fifth insulating layer 316 on the third gate electrode 344. For example, the fifth insulating layer 316 may contact a top surface (or an upper surface) of the third gate electrode 344 of the third transistor 340. For example, the fifth insulating layer 316 may contact a top surface (or an upper surface) of the third insulating layer 313a of the third transistor 340. For example, the fifth insulating layer 316 may contact a top surface (or an upper surface) of the third gate electrode 344 and a top surface (or an upper surface) of the third insulating layer 313a.

Referring to FIG. 7A, the third insulating layer 313a is formed on the first transistor 370 and the third transistor 340, and the first gate electrode 373 is formed in the first transistor 370. The fourth insulating layer 313b is formed on the first gate electrode 373 and the third insulating layer 313a, and the third gate electrode 344 is formed on the fourth insulating layer 313b. In addition, the fourth insulating layer 313b of the first transistor 370 may be etched (indicated by an arrow) except for the fourth insulating layer 313b of the third transistor 340. For example, the etching may be wet etching or dry etching, but embodiments of the present disclosure are not limited thereto. For example, the fourth insulating layer 313b of the second transistor 360 may be etched in the same manner Parts of the third insulating layer 313a and the fourth insulating layer 313b of the third transistor 340 may not be etched by using the third gate electrode 344 as a mask. For example, except for the third insulating layer 313a and the fourth insulating layer 313b under the third gate electrode 344 of the third transistor 340, the fourth insulating layer 313b of the first transistor 370 and the fourth insulating layer 313b of the second transistor 360 may be etched. For example, the third insulating layer 313a, the fourth insulating layer 313b, and the third gate electrode 344 of the third transistor 340 may overlap a portion of the third semiconductor layer 312.

Referring to FIG. 7B, conductorization processes (indicated by arrows) of the first semiconductor layer 315 of the first transistor 370 and the third semiconductor layer 312 of the third transistor 340 may be performed. For example, conductorization processes (indicated by arrows) of the first semiconductor layer 315 of the first transistor 370 and the third semiconductor layer 312 of the third transistor 340 may be simultaneously performed. For example, a conductorization process of the second semiconductor layer 311 of the second transistor 360 may be also performed at the same time. Accordingly, the third semiconductor layer 312 may include the third source region 312S, the third channel region 312C, and the third drain region 312D. The first semiconductor layer 315 may include the first source region 315S, the first channel region 315C, and the first drain region 315D. The second semiconductor layer 311 may include the second source region 311S, the second channel region 311C, and the second drain region 311D.

According to an embodiment of the present specification, since the thicknesses of the conductive regions of the first transistor 370 and the third transistor 340 are the same, the first semiconductor layer 315 and the third semiconductor layer 312 can be doped with the same doping concentration during the conductorization process thereof. For example, since the third insulating layer 313a is present in the conductive regions of the first transistor 370 and the third transistor 340, the first semiconductor layer 315 and the third semiconductor layer 312 can be doped with the same doping concentration in the conductorization process thereof. For example, since there is only the third insulating layer 313a in the conductive region of the first transistor 370 and the third transistor 340, the first semiconductor layer 315 and the third semiconductor layer 312 may be doped with the same doping concentration in the conductorization process thereof. For example, since the conductive regions of the first transistor 370, the second transistor 360, and the third transistor 340 have the same thickness, the first semiconductor layer 315, the second semiconductor layer 311 and the third semiconductor layer 340 can be doped at the same doping concentration in the conductorization process thereof. For example, since the third insulating layer 313a is provided in the conductive regions of the first transistor 370, the second transistor 360, and the third transistor 340, the first semiconductor layer 315, the second semiconductor layer 311 and the third semiconductor layer 312 can be doped at the same doping concentration in the conductorization process thereof. For example, since there is only the third insulating layer 313a in the conductive regions of the first transistor 370, the second transistor 360, and the third transistor 340, the first semiconductor layer 315, the second semiconductor layer 311 and the third semiconductor layer 312 may be doped at the same doping concentration in the conductorization process thereof. As a result, it is possible to solve the problem that the doping concentration of the third semiconductor layer 312 is different due to the difference in thickness of the third insulating layer 313a and the fourth insulating layer 313b, and thus element characteristics of the third transistor 340 may be improved.

Referring to FIG. 7C, the fifth insulating layer 316 is formed on the first gate electrode 373 and the third gate electrode 344. For example, the fifth insulating layer 316 is formed on the first gate electrode 373, the second gate electrode 314, and the third gate electrode 344. The fifth insulating layer 316 may cover the first gate electrode 373 and the third gate electrode 344. For example, the fifth insulating layer 316 may cover the first gate electrode 373, the second gate electrode 314, and the third gate electrode 344. The fifth insulating layer 316 may be disposed on the fourth insulating layer 313b and the third gate electrode 344. For example, the fifth insulating layer 316 may cover the fourth insulating layer 313b and the third gate electrode 344.

The first transistor 370 and the third transistor 340 may be configured by forming the first source electrode 375S, the first drain electrode 375D, the third source electrode 328S and the third drain electrode 328D on the fifth insulating layer 316. The second transistor 360 may be configured through the same process as the first transistor 370. The second transistor 360 may be configured by forming the second source electrode 319S and the second drain electrode 319D on the fifth insulating layer 316.

According to an embodiment of the present disclosure, the third transistor 340 including the third insulating layer 313a and the fourth insulating layer 313b is configured, and the fourth insulating layer 313b of the third transistor 340 is etched and then the conductorization process of the third semiconductor layer 312 is performed, so that it is possible to solve the problem that the doping concentration of the third semiconductor layer 312 of the third transistor 340 is different due to the difference in thickness of the third insulating layer 313a and the fourth insulating layer 313b. According to an embodiment of the present disclosure, since the first semiconductor layer 315, the second semiconductor layer 311, and the third semiconductor layer 312 are formed of oxide semiconductor layers, the conductorization process of the first semiconductor layer 315, the second semiconductor layer 311 and the third semiconductor layer 312 can be simultaneously performed. Accordingly, the process may be simplified and the manufacturing cost of the display apparatus may be reduced.

A display apparatus according to one or more embodiments of the present disclosure may be applied to or included in a mobile device, a video phone, a smart watch, a watch phone, a wearable apparatus, a foldable apparatus, a rollable apparatus, a bendable apparatus, a flexible apparatus, a curved apparatus, a sliding apparatus, a variable apparatus, an electronic notebook, an electronic book, a portable multimedia player (PMP), a personal digital assistant (PDA), a MP3 player, a mobile medical apparatus, a desktop PC, a laptop PC, a netbook computer, a workstation, a navigation, a vehicle navigation, a vehicle display apparatus, a vehicle apparatus, a theater apparatus, a theater display apparatus, a television, a wallpaper apparatus, a signage apparatus, a game apparatus, a laptop computer, a monitor, a camera, a camcorder, and a home appliance. In addition, the display apparatus of or one or more embodiments of the present disclosure may be applied to or included in an organic light emitting lighting apparatus or an inorganic light emitting lighting apparatus.

A display apparatus according to one or more embodiments of the present disclosure are described below.

A display apparatus according to one or more embodiments of the present disclosure may include a substrate including a display area and a non-display area, a first transistor including a first oxide semiconductor layer on the substrate, a first insulating layer on the first oxide semiconductor layer and a first gate electrode on the first insulating layer, a second transistor including a second oxide semiconductor layer on the substrate, a second gate electrode on the first insulating layer and a second insulating layer on the second gate electrode, and a third transistor including a third oxide semiconductor layer on the substrate and a third gate electrode on the second insulating layer.

According to one or more embodiments of the present disclosure, the first insulating layer of the second transistor may be between the second oxide semiconductor layer and the second gate electrode.

According to one or more embodiments of the present disclosure, the first insulating layer of the third transistor may be between the third oxide semiconductor layer and the second insulating layer, and the second insulating layer of the second transistor may be spaced apart from the second insulating layer of the third transistor.

A display apparatus according to one or more embodiments of the present disclosure may include a substrate including a display area and a non-display area, a first transistor including a first oxide semiconductor layer on the substrate, a first insulating layer on the first oxide semiconductor layer, and a first gate electrode on the first insulating layer, a second transistor including a second oxide semiconductor layer on the substrate, a first insulating layer on the second oxide semiconductor layer, and a second gate electrode on the first insulating layer, and a third transistor including a third oxide semiconductor layer on the substrate, a first insulating layer on the third oxide semiconductor layer, a second insulating layer on the first insulating layer, and a third gate electrode on the second insulating layer.

According to one or more embodiments of the present disclosure, the third oxide semiconductor layer may include a third channel region, and the second insulating layer of the third transistor may overlap the third channel region.

According to one or more embodiments of the present disclosure, the third oxide semiconductor layer may include a third channel region, and the second insulating layer and the third gate electrode of the third transistor may overlap the third channel region.

According to one or more embodiments of the present disclosure, the display apparatus may further include a first source electrode and a first drain electrode on the first gate electrode, a second source electrode and a second drain electrode on the second gate electrode, and a third source electrode and a third drain electrode on the third gate electrode.

According to one or more embodiments of the present disclosure, the second insulating layer may be in (or inside) the third source electrode and the third drain electrode.

According to one or more embodiments of the present disclosure, the second insulating layer and the third gate electrode may be in (or inside) the third source electrode and the third drain electrode.

According to one or more embodiments of the present disclosure, the display apparatus may further include a third insulating layer on the first insulating layer, and the third insulating layer may cover the first insulating layer.

According to one or more embodiments of the present disclosure, the first insulating layer of the first transistor may be on the first oxide semiconductor layer of the first transistor, the first insulating layer of the second transistor may be on the second oxide semiconductor layer of the second transistor, and the first insulating layer of the third transistor may be on the third oxide semiconductor layer of the third transistor.

According to one or more embodiments of the present disclosure, a distance between the first oxide semiconductor layer and the first gate electrode may be equal to a distance between the second oxide semiconductor layer and the second gate electrode.

According to one or more embodiments of the present disclosure, a distance between the first oxide semiconductor layer and the first gate electrode may be different from a distance between the third oxide semiconductor layer and the third gate electrode.

According to one or more embodiments of the present disclosure, a distance between the first oxide semiconductor layer and the first gate electrode may be smaller than a distance between the third oxide semiconductor layer and the third gate electrode.

According to one or more embodiments of the present disclosure, a distance between the second oxide semiconductor layer and the second gate electrode may be different from a distance between the third oxide semiconductor layer and the third gate electrode.

According to one or more embodiments of the present disclosure, a distance between the second oxide semiconductor layer and the second gate electrode may be smaller than a distance between the third oxide semiconductor layer and the third gate electrode.

According to one or more embodiments of the present disclosure, a capacitance between the third oxide semiconductor layer and the third gate electrode may be smaller than a capacitance between the first oxide semiconductor layer and the first gate electrode.

According to one or more embodiments of the present disclosure, a capacitance between the third oxide semiconductor layer and the third gate electrode may be smaller than a capacitance between the second oxide semiconductor layer and the second gate electrode.

According to one or more embodiments of the present disclosure, the first gate electrode may be at a different layer from the third gate electrode.

According to one or more embodiments of the present disclosure, the second gate electrode may be at a different layer from the third gate electrode.

According to one or more embodiments of the present disclosure, the display apparatus may further include a fourth gate electrode below the first oxide semiconductor layer, a fifth gate electrode below the second oxide semiconductor layer, and a sixth gate electrode below the third oxide semiconductor layer.

According to one or more embodiments of the present disclosure, a distance between the fourth gate electrode and the first oxide semiconductor layer may be smaller than a distance between the fifth gate electrode and the second oxide semiconductor layer.

According to one or more embodiments of the present disclosure, a distance between the fourth gate electrode and the first oxide semiconductor layer may be smaller than a distance between the sixth gate electrode and the third oxide semiconductor layer.

According to one or more embodiments of the present disclosure, the display apparatus may further include a first source electrode and a first drain electrode on the first gate electrode, a second source electrode and a second drain electrode on the second gate electrode, and a third source electrode and a third drain electrode on the third gate electrode. The first source electrode may be connected to the fourth gate electrode.

According to one or more embodiments of the present disclosure, a thickness of the first insulating layer may be different from a thickness of the second insulating layer.

According to one or more embodiments of the present disclosure, the non-display area may include a gate driving part, and the display apparatus may further include a fourth transistor disposed in the gate driving part and including a fourth semiconductor layer.

According to one or more embodiments of the present disclosure, the fourth semiconductor layer may include a polycrystalline semiconductor layer.

According to one or more embodiments of the present disclosure, the display apparatus may further include an emitting element in the display area, an encapsulation part on the emitting element, and a touch part on the encapsulation part.

According to one or more embodiments of the present disclosure, the display apparatus may further include a color filter on the touch part or between the touch part and the encapsulation part.

A display apparatus according to one or more embodiments of the present disclosure may include a substrate, a first transistor including a first source electrode and a first drain electrode on the substrate and a first gate electrode on the first source electrode and the first drain electrode, a second transistor including a second source electrode and a second drain electrode on the substrate and a second gate electrode on the second source electrode and the second drain electrode, a third transistor including a third source electrode and a third drain electrode on the substrate and a third gate electrode on the third source electrode and the third drain electrode, a first insulating layer in the first transistor, the second transistor and the third transistor, and on the first source electrode, the first drain electrode, the second source electrode, the second drain electrode, the third source electrode and the third drain electrode, and a second insulating layer in the second transistor and the third transistor, and the second insulating layer in the second transistor is spaced apart from and second insulating layer in the third transistor.

According to one or more embodiments of the present disclosure, the first transistor may not comprise the second insulating layer.

According to one or more embodiments of the present disclosure, in the second transistor, the second insulating layer may be on the second gate electrode.

According to one or more embodiments of the present disclosure, in the third transistor, the second insulating layer may be between the first insulating layer and the second gate electrode.

According to one or more embodiments of the present disclosure, since at least two insulating layers are formed on a semiconductor layer, sensitivity due to change in threshold voltage of a transistor may be reduced.

According to one or more embodiments of the present disclosure, since a process of conductorizing a semiconductor layer is performed by etching one of at least two insulating layers, it is possible to solve a problem in that semiconductor layers have different doping concentrations or are not doped due to a difference in thickness of at least two insulating layers. Accordingly, element characteristics of transistors may be improved.

It will be apparent to those skilled in the art that various modifications and variations can be made in the present disclosure without departing from the scope of the present disclosure. Thus, it is intended that the present disclosure cover the modifications and variations of this disclosure provided they come within the scope of the appended claims and their equivalents.

What is claimed is:

1. A display apparatus, comprising:
a substrate including a display area and a non-display area;
a first transistor including a first oxide semiconductor layer on the substrate, a first insulating layer on the first oxide semiconductor layer and a first gate electrode on the first insulating layer;
a second transistor including a second oxide semiconductor layer on the substrate, a second gate electrode on the first insulating layer and a portion of a second insulating layer on the second gate electrode; and
a third transistor including a third oxide semiconductor layer on the substrate and a third gate electrode on another portion of the second insulating layer, wherein the first insulating layer and the another portion of the second insulating layer is on the third oxide semiconductor layer.

2. The display apparatus of claim 1, wherein the first insulating layer is between the second oxide semiconductor layer and the second gate electrode.

3. The display apparatus of claim 1, wherein the first insulating layer is between the third oxide semiconductor layer and the second insulating layer, and wherein the portion of the second insulating layer is spaced apart from the another portion of the second insulating layer.

4. The display apparatus of claim 1, wherein a distance between the first oxide semiconductor layer and the first gate electrode is equal to a distance between the second oxide semiconductor layer and the second gate electrode.

5. The display apparatus of claim 1, wherein a distance between the first oxide semiconductor layer and the first gate electrode is different from a distance between the third oxide semiconductor layer and the third gate electrode.

6. The display apparatus of claim 1, wherein a distance between the first oxide semiconductor layer and the first gate electrode is smaller than a distance between the third oxide semiconductor layer and the third gate electrode.

7. The display apparatus of claim 1, wherein a distance between the second oxide semiconductor layer and the second gate electrode is different from a distance between the third oxide semiconductor layer and the third gate electrode.

8. The display apparatus of claim 1, wherein a distance between the second oxide semiconductor layer and the second gate electrode is smaller than a distance between the third oxide semiconductor layer and the third gate electrode.

9. The display apparatus of claim 1, wherein a capacitance between the third oxide semiconductor layer and the third gate electrode is smaller than a capacitance between the first oxide semiconductor layer and the first gate electrode.

10. The display apparatus of claim 1, wherein a capacitance between the third oxide semiconductor layer and the third gate electrode is smaller than a capacitance between the second oxide semiconductor layer and the second gate electrode.

11. The display apparatus of claim 1, wherein the first gate electrode is on a different layer from a layer the third gate electrode is on.

12. The display apparatus of claim 1, wherein the second gate electrode is on a different layer from a layer the third gate electrode is on.

13. The display apparatus of claim 1, further comprising:
a fourth gate electrode of the first transistor, below the first oxide semiconductor layer;
a fifth gate electrode of the second transistor, below the second oxide semiconductor layer; and
a sixth gate electrode of the third transistor, below the third oxide semiconductor layer.

14. The display apparatus of claim 13, wherein a distance between the fourth gate electrode and the first oxide semiconductor layer is smaller than a distance between the fifth gate electrode and the second oxide semiconductor layer.

15. The display apparatus of claim 13, wherein a distance between the fourth gate electrode and the first oxide semiconductor layer is smaller than a distance between the sixth gate electrode and the third oxide semiconductor layer.

16. The display apparatus of claim 13, further comprising:
a first source electrode and a first drain electrode on the first gate electrode;
a second source electrode and a second drain electrode on the second gate electrode; and
a third source electrode and a third drain electrode on the third gate electrode,
wherein the first source electrode is connected to the fourth gate electrode.

17. The display apparatus of claim 1, wherein a thickness of the first insulating layer is different from a thickness of the second insulating layer.

18. The display apparatus of claim 1, wherein the non-display area includes a gate driving part, and wherein the display apparatus further comprises a fourth transistor in the gate driving part and including a fourth semiconductor layer.

19. The display apparatus of claim 18, wherein the fourth semiconductor layer includes a polycrystalline semiconductor layer.

20. The display apparatus of claim 1, further comprising:

an emitting element in the display area and above the first transistor, the second transistor and the third transistor;

an encapsulation part on the emitting element; and a touch part on the encapsulation part.

21. The display apparatus of claim 20, further comprising a color filter on the touch part or between the touch portion and the encapsulation part.

22. The display apparatus of claim 1, wherein a thickness of the first insulating layer is smaller than a thickness of the second insulating layer.

23. A display apparatus, comprising:

a substrate including a display area and a non-display area;

a first transistor including a first oxide semiconductor layer on the substrate, a first insulating layer on the first oxide semiconductor layer, and a first gate electrode on the first insulating layer;

a second transistor including a second oxide semiconductor layer on the substrate, the first insulating layer on the second oxide semiconductor layer, and a second gate electrode on the first insulating layer; and a third transistor including a third oxide semiconductor layer on the substrate, the first insulating layer on the third oxide semiconductor layer, a second insulating layer on the first insulating layer, and a third gate electrode on the second insulating layer.

24. The display apparatus of claim 23, wherein the third oxide semiconductor layer includes a third channel region, and wherein the second insulating layer overlaps the third channel region.

25. The display apparatus of claim 23, wherein the third oxide semiconductor layer includes a third channel region, and wherein the second insulating layer and the third gate electrode of the third transistor overlap the third channel region.

26. The display apparatus of claim 23, further comprising:

a first source electrode and a first drain electrode on the first gate electrode;

a second source electrode and a second drain electrode on the second gate electrode; and a third source electrode and a third drain electrode on the third gate electrode.

27. The display apparatus of claim 26, wherein the second insulating layer of the third transistor is within the third source electrode and the third drain electrode.

28. The display apparatus of claim 26, wherein the second insulating layer and the third gate electrode of the third transistor are within the third source electrode and the third drain electrode.

29. The display apparatus of claim 26, further comprising a third insulating layer on the third gate electrode, wherein the third insulating layer covers the first insulating layer and the second insulating layer.

30. The display apparatus of claim 23, wherein the first insulating layer of the first transistor is on the first oxide semiconductor layer of the first transistor, wherein the first insulating layer of the second transistor is on the second oxide semiconductor layer of the second transistor, and wherein the first insulating layer of the third transistor is on the third oxide semiconductor layer of the third transistor.

31. The display apparatus of claim 23, wherein a distance between the first oxide semiconductor layer and the first gate electrode is equal to a distance between the second oxide semiconductor layer and the second gate electrode.

32. The display apparatus of claim 23, wherein a distance between the first oxide semiconductor layer and the first gate electrode is different from a distance between the third oxide semiconductor layer and the third gate electrode.

33. The display apparatus of claim 23, wherein a distance between the first oxide semiconductor layer and the first gate electrode is smaller than a distance between the third oxide semiconductor layer and the third gate electrode.

34. The display apparatus of claim 23, wherein a distance between the second oxide semiconductor layer and the second gate electrode is different from a distance between the third oxide semiconductor layer and the third gate electrode.

35. The display apparatus of claim 23, wherein a distance between the second oxide semiconductor layer and the second gate electrode is smaller than a distance between the third oxide semiconductor layer and the third gate electrode.

36. The display apparatus of claim 23, wherein a capacitance between the third oxide semiconductor layer and the third gate electrode is smaller than a capacitance between the first oxide semiconductor layer and the first gate electrode.

37. The display apparatus of claim 23, wherein a capacitance between the third oxide semiconductor layer and the third gate electrode is smaller than a capacitance between the second oxide semiconductor layer and the second gate electrode.

38. The display apparatus of claim 23, wherein the first gate electrode is on a different layer from a layer the third gate electrode is on.

39. The display apparatus of claim 23, wherein the second gate electrode is on a different layer from a layer the third gate electrode is on.

40. The display apparatus of claim 23, further comprising:

a fourth gate electrode of the first transistor, below the first oxide semiconductor layer;

a fifth gate electrode of the second transistor, below the second oxide semiconductor layer; and a sixth gate electrode of the third transistor, below the third oxide semiconductor layer.

41. The display apparatus of claim 40, wherein a distance between the fourth gate electrode and the first oxide semiconductor layer is smaller than a distance between the fifth gate electrode and the second oxide semiconductor layer.

42. The display apparatus of claim 40, wherein a distance between the fourth gate electrode and the first oxide semiconductor layer is smaller than a distance between the sixth gate electrode and the third oxide semiconductor layer.

43. The display apparatus of claim 40, further comprising:

a first source electrode and a first drain electrode on the first gate electrode;

a second source electrode and a second drain electrode on the second gate electrode; and a third source electrode and a third drain electrode on the third gate electrode, wherein the first source electrode is connected to the fourth gate electrode.

44. The display apparatus of claim 23, wherein a thickness of the first insulating layer is different from a thickness of the second insulating layer.

45. The display apparatus of claim 23, wherein the non-display area includes a gate driving part, and wherein the display apparatus further comprises a fourth transistor in the gate driving part and including a fourth semiconductor layer.

46. The display apparatus of claim 45, wherein the fourth semiconductor layer includes a polycrystalline semiconductor layer.

47. The display apparatus of claim 23, further comprising:

an emitting element in the display area and above the first transistor, the second transistor and the third transistor;

an encapsulation part on the emitting element; and a touch part on the encapsulation part.

48. The display apparatus of claim 47, further comprising a color filter on the touch part or between the touch part and the encapsulation part.

49. The display apparatus of claim 23, wherein a thickness of the first insulating layer is smaller than a thickness of the second insulating layer.

* * * * *